US012646734B2

(12) United States Patent
Sasago et al.

(10) Patent No.: US 12,646,734 B2
(45) Date of Patent: Jun. 2, 2026

(54) FUEL CELL ARRAY AND FUEL CELL INSPECTION METHOD

(71) Applicant: Hitachi High-Tech Corporation, Tokyo (JP)

(72) Inventors: Yoshitaka Sasago, Tokyo (JP); Noriyuki Sakuma, Tokyo (JP); Yumiko Anzai, Tokyo (JP); Sonoko Migitaka, Tokyo (JP); Natsuki Yokoyama, Tokyo (JP); Takashi Tsutsumi, Tokyo (JP); Aritoshi Sugimoto, Tokyo (JP); Toru Aramaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 989 days.

(21) Appl. No.: 17/771,559

(22) PCT Filed: Nov. 7, 2019

(86) PCT No.: PCT/JP2019/043687
§ 371 (c)(1),
(2) Date: Apr. 25, 2022

(87) PCT Pub. No.: WO2021/090442
PCT Pub. Date: May 14, 2021

(65) Prior Publication Data
US 2022/0384835 A1      Dec. 1, 2022

(51) Int. Cl.
*H01M 8/2418*          (2016.01)
*H01M 8/0202*          (2016.01)
(Continued)

(52) U.S. Cl.
CPC ....... *H01M 8/2418* (2016.02); *H01M 8/0202* (2013.01); *H01M 8/0247* (2013.01);
(Continued)

(58) Field of Classification Search
None
See application file for complete search history.

(56) References Cited

U.S. PATENT DOCUMENTS

| | | | | |
|---|---|---|---|---|
| 5,180,641 | A | * | 1/1993 | Burns ...................... H02H 7/18 |
| | | | | 429/61 |
| 5,306,653 | A | | 4/1994 | Hur |

(Continued)

FOREIGN PATENT DOCUMENTS

| | | | | |
|---|---|---|---|---|
| EP | | 1294039 A1 | * | 3/2003 .......... H01M 4/8807 |
| JP | | 47-36863 A | | 11/1972 |

(Continued)

OTHER PUBLICATIONS

Periasamy et al, Metal-Insulator-Metal Diodes: Role of the Insulator Layer on the Rectification Performance, Jan. 3, 2013, Advance Materials, 1301-1308 (Year: 2013).*
(Continued)

*Primary Examiner* — Mary Grace Byram
(74) *Attorney, Agent, or Firm* — Crowell & Moring LLP

(57) ABSTRACT

The present invention aims to reduce a failure in a fuel cell module and reduce manufacturing costs by specifying and taking countermeasures against cells in short-circuit failure from among fuel cells manufactured on a substrate by using a thin-film deposition process. In a fuel cell array according to the present invention, each fuel cell includes a solid electrolyte layer between a first electrode layer and a second electrode layer. A first wiring is connected to the second electrode layer, and a second wiring is connected to the first electrode layer through a connection element. The connection element is formed by sandwiching a conductive layer between two electrodes (refer to FIG. 8).

14 Claims, 37 Drawing Sheets

(51) Int. Cl.

| | |
|---|---|
| *H01M 8/0247* | (2016.01) |
| *H01M 8/04223* | (2016.01) |
| *H01M 8/04537* | (2016.01) |
| *H01M 8/04664* | (2016.01) |
| *H01M 8/1097* | (2016.01) |
| *H01M 8/12* | (2016.01) |
| *H01M 8/1213* | (2016.01) |
| *H01M 8/1286* | (2016.01) |
| *H01M 8/2428* | (2016.01) |
| *H01M 8/2465* | (2016.01) |
| *H10D 1/40* | (2025.01) |
| *H10D 8/00* | (2025.01) |
| *H10D 30/60* | (2025.01) |
| *H10D 62/80* | (2025.01) |
| *H10D 62/83* | (2025.01) |
| *H10D 86/40* | (2025.01) |
| *H10D 86/60* | (2025.01) |

(52) U.S. Cl.
CPC ... *H01M 8/04246* (2013.01); *H01M 8/04552*
(2013.01); *H01M 8/04582* (2013.01); *H01M
8/04671* (2013.01); *H01M 8/1097* (2013.01);
*H01M 8/12* (2013.01); *H01M 8/1213*
(2013.01); *H01M 8/1286* (2013.01); *H01M
8/2428* (2016.02); *H01M 8/2465* (2013.01);
*H01M 2008/1293* (2013.01); *H10D 1/40*
(2025.01); *H10D 8/00* (2025.01); *H10D 8/411*
(2025.01); *H10D 30/60* (2025.01); *H10D
62/80* (2025.01); *H10D 62/83* (2025.01);
*H10D 86/40* (2025.01); *H10D 86/60* (2025.01)

(56) References Cited

U.S. PATENT DOCUMENTS

| | | | |
|---|---|---|---|
| 2002/0045082 A1 | 4/2002 | Marsh | |
| 2003/0170520 A1 | 9/2003 | Fujii et al. | |
| 2004/0146772 A1* | 7/2004 | Miyao | H01M 8/04007 |
| | | | 429/457 |
| 2007/0281194 A1* | 12/2007 | Cortright | H01M 8/2484 |
| | | | 429/456 |
| 2010/0021781 A1* | 1/2010 | Sato | H01M 8/04552 |
| | | | 429/492 |
| 2017/0222208 A1* | 8/2017 | Yamazaki | H01G 11/06 |
| 2020/0103950 A1* | 4/2020 | Halsey | H02J 7/0018 |

FOREIGN PATENT DOCUMENTS

| | | |
|---|---|---|
| JP | 2-293822 A | 12/1990 |
| JP | 5-218083 A | 8/1993 |
| JP | 2003-532977 A | 11/2003 |
| JP | 2009-528666 A | 8/2009 |
| WO | WO 02/080299 A1 | 10/2002 |
| WO | WO 2007/103104 A2 | 9/2007 |

OTHER PUBLICATIONS

International Search Report (PCT/ISA/210) issued in PCT Application No. PCT/JP2019/043687 dated Feb. 4, 2020 with English translation (four (4) pages).
Japanese-language Written Opinion (PCT/ISA/237) issued in PCT Application No. PCT/JP2019/043687 dated Feb. 4, 2020 (three (3) pages).
Evans, A. et al., "Review on microfabricated micro-solid oxide fuel cell membranes", Journal of Power Sources 194 (2009), pp. 119-129 (11 pages).

* cited by examiner

CELL

22

12

CELL C          CELL D

TPPAD

BPPAD

CELL B          CELL A

SELECTED CELL

12

TPPAD

BPPAD

CELL C          CELL B          CELL A          22

SELECTED CELL

FUEL CELL ARRAY AND FUEL CELL INSPECTION METHOD

TECHNICAL FIELD

The present invention relates to a solid oxide fuel cell in which a solid electrolyte layer is formed by a film deposition process.

BACKGROUND ART

As the background art in the present technical field, there are Japanese Unexamined Patent Application Publication No. 2009-528666 (Patent Literature 1) and Journal of Power Sources 194 (2009) 119-129 (Nonpatent Literature 1).

Nonpatent Literature 1 describes a cell technique of forming an anode layer, a solid electrolyte layer, and a cathode layer of a fuel cell membrane by a thin film deposition process. By thinning a solid electrolyte, it is possible to improve ion conductivity and improve power generation efficiency. The ion conductivity of the solid electrolyte shows active-type temperature dependence. Therefore, the ion conductivity is high at high temperatures and low at low temperatures. With the thinning of the solid electrolyte, sufficiently large ion conductivity can be obtained even at low temperatures, and practical power generation efficiency can be realized. As the solid electrolyte layer, for example, YSZ (Yttria Stabilized Zirconia) being zirconia doped with yttria or the like is often used. This is because it has the advantage that it is excellent in chemical stability and there is little current due to electrons and holes which cause an internal leakage current of the fuel cell.

When the solid electrolyte layer is formed in the thin film deposition process, the resistance accompanying the ion conduction of oxygen ions or protons moved in the film thickness direction through the solid electrolyte layer is reduced, so that a power loss inside the fuel cell is reduced. As a result, it is possible to improve the output. However, on the other hand, as a result of the decrease in the film thickness of the solid electrolyte, the probability that an internal leak due to electron conduction or hole conduction between upper and lower electrodes via the solid electrolyte layer, or in an extreme case, a short-circuit failure between the upper and lower electrodes will occur increases.

When a short circuit occurs between the upper and lower electrodes, it becomes impossible to take out the electric power to the outside and use it during operation of the fuel cell is operating. Therefore, if the fabrication of a module using cells is not performed after taking measures such as removing a cell in which the short circuit occurs between the upper and lower electrodes or disconnecting the cell from a wiring, the yield of the module is extremely reduced. As a result, the cost of the fuel cell module increases.

In order to take measures such as removing the cell in which the short circuit occurs between the upper and lower electrodes or disconnecting the same from the wiring, it is necessary to specify the location of the cell with the short-circuit failure from within an array.

Patent Literature 1 discloses the technology of after manufacturing the module, evaluating power generation characteristics, monitoring an output current of a parallel cell array or an output voltage of a series cell array, and determining that the module is defective where it is lower than the normal value.

CITATION LIST

Patent Literature

PTL 1: Japanese Unexamined Patent Application Publication No. 2009-528666 Nonpatent Literature
NPTL 1: Journal of Power Sources 194 (2009) 119-129

SUMMARY OF INVENTION

Technical Problem

Defective cells can be detected if each fuel cell on a substrate is individually wired to inspect each fuel cell, but the number of inspections is required only as many as the number of cells on the substrate. In addition, when manufacturing a module using the manufactured fuel cell, the individual cells must be reconnected with wiring. Therefore, the manufacturing cost increases. In order to reduce the cost, it is necessary to manufacture a structure in which a plurality of fuel cells are connected to each other by wiring in advance, and to be able to detect a cell in short-circuit failure.

The present invention has been made in view of the above problems, and an object thereof is to reduce a failure in a fuel cell module and reduce manufacturing costs by specifying and taking countermeasures against cells in short-circuit failure from among fuel cells manufactured on a substrate by using a thin-film deposition process.

Solution to Problem

In a fuel cell array according to the present invention, a fuel cell includes a solid electrolyte layer between a first electrode layer and a second electrode layer. A first wiring is connected to the second electrode layer, and a second wiring is connected to the first electrode layer through a connection element. The connection element is formed by sandwiching a conductive layer between two electrodes.

Advantageous Effects of Invention

According to the fuel cell array according to the present invention, it is possible to specify a cell being in short-circuit failure from among fuel cells manufactured on a substrate by using a thin film deposition process. Thus, it is possible to reduce a failure in a fuel cell module and reduce manufacturing costs. Problems, configurations, and effects other than those described above will be clarified by the following description of embodiments.

DESCRIPTION OF EMBODIMENTS

Figure 1:
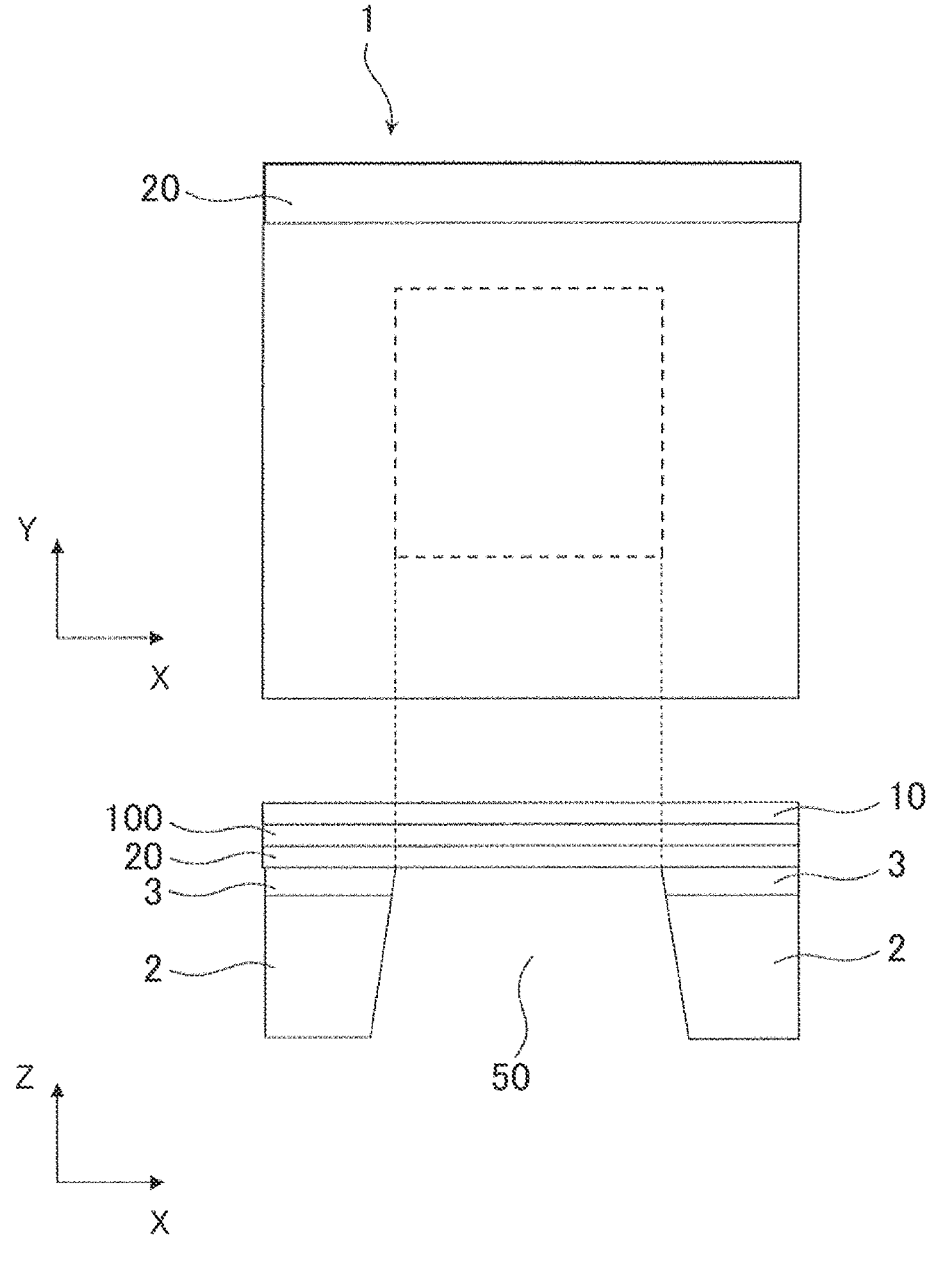
FIG. 1 is a diagram showing a general structure of a fuel cell 1 which includes a thinned solid electrolyte layer.

Hereinafter, embodiments will be described in detail based on the drawings. Incidentally, in all the drawings for explaining the embodiments, members having the same function are designated by the same or related reference numerals, and repeated description thereof will be omitted. In addition, when a plurality of similar members (portions) exist, a symbol may be added to the generic code to indicate an individual or a specific portion. Further, in the following embodiments, the description of the same or similar parts will not be repeated in principle except when it is particularly necessary.

In the following embodiments, an X direction, a Y direction, and a Z direction are used as explanatory directions. The X direction and the Y direction are orthogonal to each other and are directions that make up a horizontal plane. The Z direction is a direction perpendicular to the horizontal plane.

In the drawings used in the embodiments, hatching may be omitted to make the drawings easier to see even if they are cross-sectional views. Further, even if they are plan views, hatching may be added to make the drawings easier to see.

In the cross-sectional view and the plan view, the size of each portion does not correspond to an actual device, and a specific portion may be displayed relatively large in order to make the drawings easy to understand. Further, even when the cross-sectional view and the plan view correspond to each other, a specific portion may be displayed relatively large in order to make the drawings easy to understand.

<Improvement in Power Generation Efficiency and Lowering of Operating Temperature by Thin Film Process Type Fuel Cell>

FIG. 1 is a diagram showing a general structure of a fuel cell 1 having a thinned solid electrolyte layer. In order to improve power generation efficiency and realize a low temperature operation, there is a need to thin the solid electrolyte layer which constitutes a membrane electrode assembly for fuel cells. A thin film process type fuel cell which forms a solid electrolyte layer in a film deposition process is optimal therefor. When an anode electrode layer, a solid electrolyte layer, and a cathode electrode layer are all thinned, the mechanical strength of the membrane electrode assembly for the fuel cells becomes weak, but can be compensated for by supporting a substrate as shown in FIG. 1. For example, silicon, ceramic, glass, metal and the like can be used for the substrate.

An insulating film 3 is formed on the upper surface of a silicon substrate 2. The insulating film 3 can be formed of, for example, a silicon oxide film or a silicon nitride film. An opening 50 is formed in the central portion of the silicon substrate 2. A lower electrode layer 20 is formed on the upper layer of the silicon substrate 2 via the insulating film 3. The lower electrode layer 20 can be formed of, for example, platinum. In the completed state of the fuel cell 1, the metal constituting the lower electrode layer 20 is made porous. The surface of a part of the lower electrode layer 20 is exposed in order to connect a wiring to the lower electrode layer 20.

An yttria-doped zirconia thin film which serves as a solid electrolyte layer 100, is formed on the upper layer of the lower electrode layer 20. The doping amount of yttria can be, for example, 3% or 8%. The solid electrolyte layer 100 is formed so as to completely cover the opening 50. The film thickness of the solid electrolyte layer 100 can be, for example, 1000 nm or less by using the technique of the present first embodiment. Since YSZ is extremely small in electron currents and Hall currents which are internal leak currents of the fuel cell 1, even at high temperatures, the solid electrolyte layer 100 can also be thinned to 100 nm or less.

The upper electrode layer 10 is formed on the upper layer of the solid electrolyte layer 100. The upper electrode layer 10 can be formed of, for example, porous platinum.

As described above, the thin film process type fuel cell 1 has the membrane electrode assembly comprised of the lower electrode layer 20 (platinum), the solid electrolyte layer 100 (polycrystalline YSZ), and the upper electrode layer 10 (platinum) from the lower layer. A fuel gas containing, for example, hydrogen is supplied to the lower electrode layer 20 side, and, for example, an oxidation gas such as air is supplied to the upper electrode layer 10 side. The lower electrode layer 20 side and the upper electrode layer 10 side are sealed therebetween so that the two types of gases to be supplied do not mix with each other.

First Embodiment: Configuration of Fuel Cell

Figure 2:
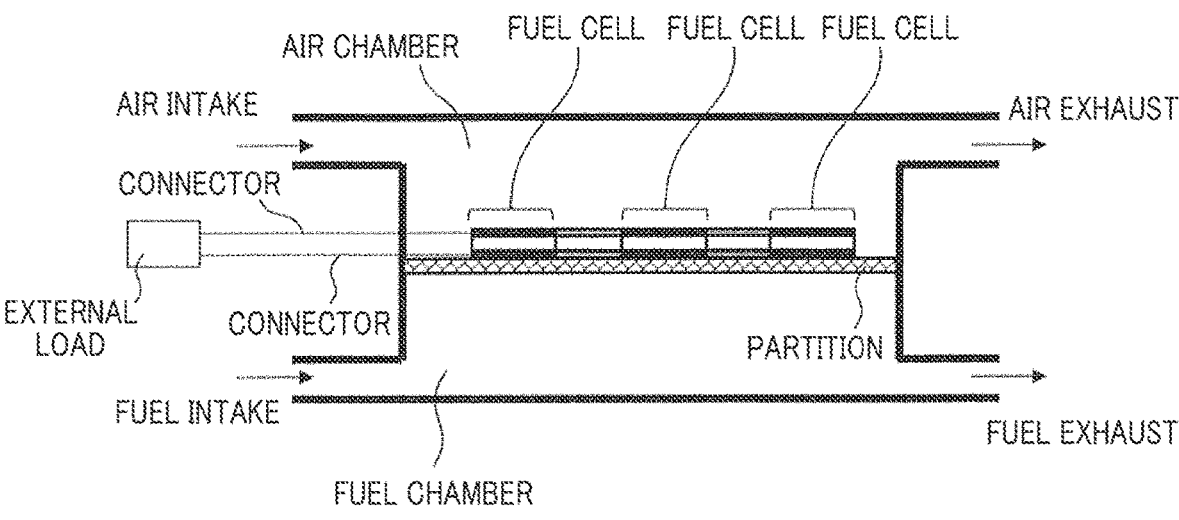
FIG. 2 is a schematic diagram showing a configuration example of a fuel cell module using a thin film process type SOFC according to a first embodiment.
Figure 2:
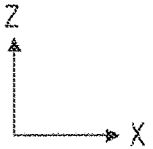

FIG. 2 is a schematic diagram showing a configuration example of a fuel cell module using a thin film process type SOFC (Solid Oxide Fuel Cell) according to the first embodiment of the present invention. A gas flow path in the module is separated into a flow path of a fuel gas and a flow path of a gas (for example, air, the same applies hereinafter) containing an oxygen gas. The flow path of the fuel gas includes a fuel intake, a fuel chamber, and a fuel exhaust. The flow path of the air includes an air intake, an air chamber, and an air exhaust. The fuel gas and air are shielded by a shielding plate partition of FIG. 2 so as not to be mixed in the module. Wiring is pulled out from each of an anode electrode and a cathode electrode of the fuel cell by a connector and connected to an external load. A plurality of fuel cells are formed on the substrate 2 in an array form and are connected to each other by wiring.

Figure 3:
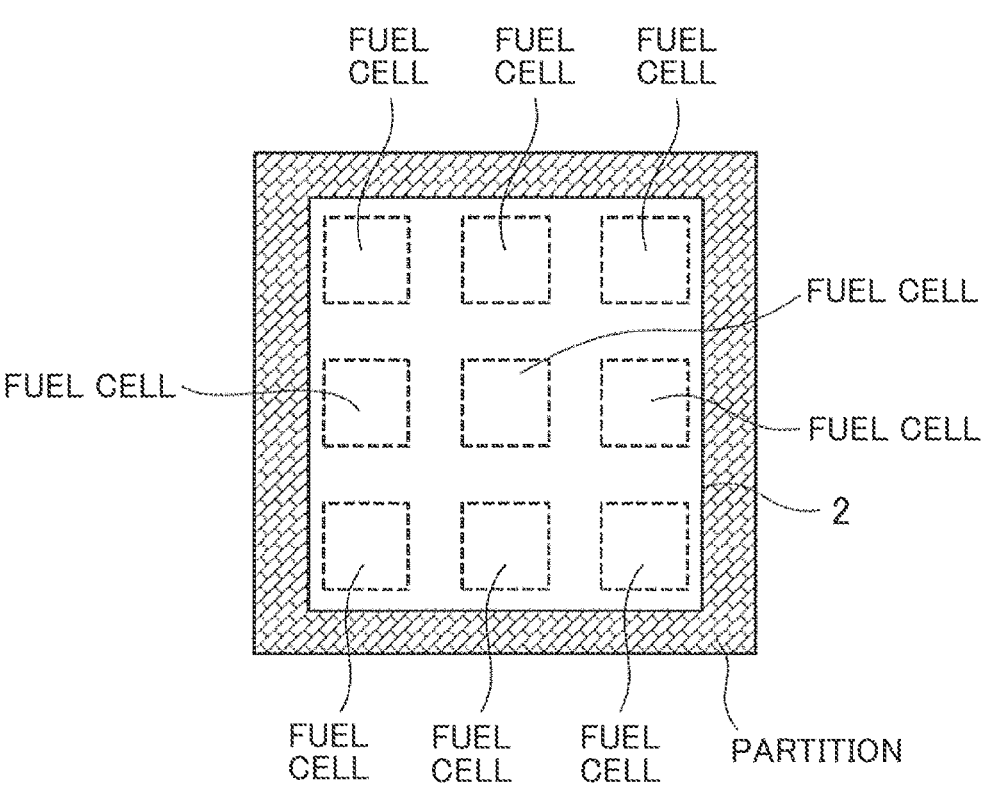
FIG. 3 is a diagram of a shielding plate Partition as viewed from the fuel cell side.
Figure 3:
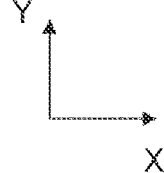

FIG. 3 is a diagram of the shielding plate partition as viewed from the fuel cell side. The substrate 2 on which the array of the fuel cells is formed is mounted on the shielding plate partition.

Figure 4:
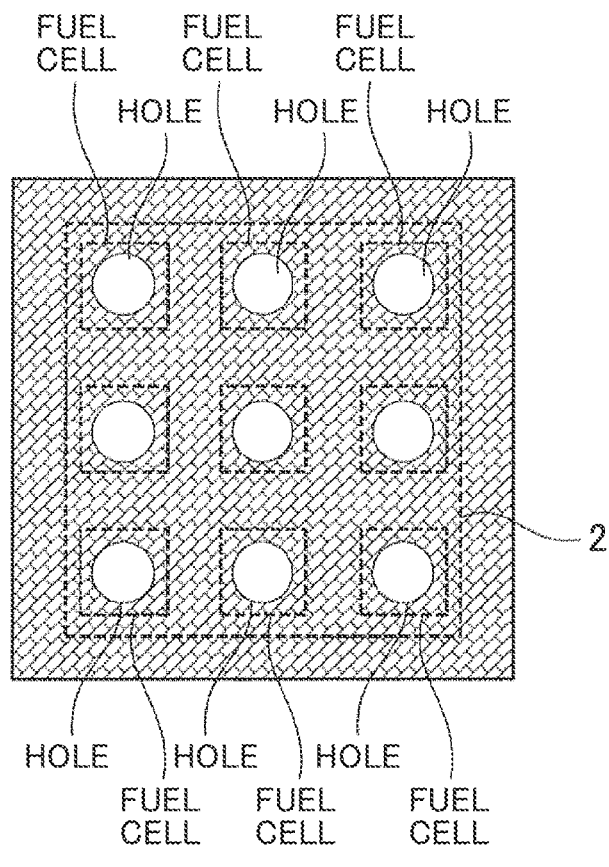
FIG. 4 is a diagram of the fuel cells as viewed from the back side of the shielding plate Partition.
Figure 4:
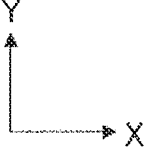

FIG. 4 is a diagram of the fuel cells as viewed from the back side of the shielding plate partition. A hole is formed in the shielding plate Partition for each fuel cell. A fuel gas is supplied to the fuel cell from a fuel gas chamber (Fuel Chamber).

Figure 5:
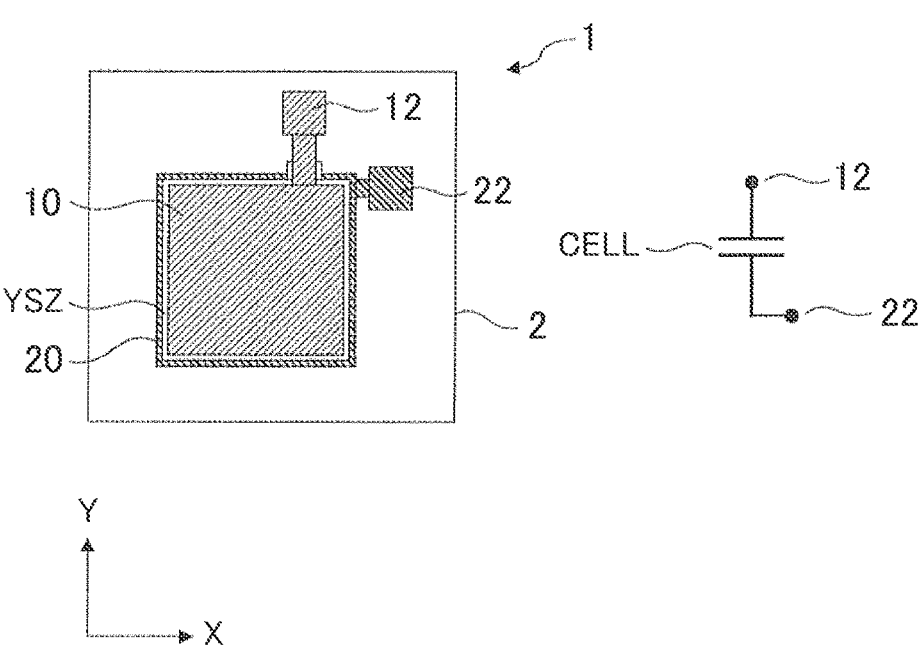
FIG. 5 is a schematic diagram showing a configuration example of a fuel cell 1 according to the first embodiment.

FIG. 5 is a schematic diagram showing a configuration example of the fuel cell 1 according to the present first embodiment. The fuel cell 1 corresponds to one of the fuel cells fuel cells shown in FIGS. 1 to 4. A plurality of fuel cells 1 each shown in FIG. 5 are usually connected and used for power generation. After forming the fuel cell array on the substrate 2, it is essential to specify defective cells by inspection in order to reduce the cost. The substrate 2 on which the fuel cell array is formed is used for assembling the fuel cell module shown in FIGS. 2 through 4. After the fuel cell module is completed, if a failure in the fuel cell that makes the fuel cell module defective is found, a fuel cell module process is wasted, thereby increasing the cost.

Figure 6:
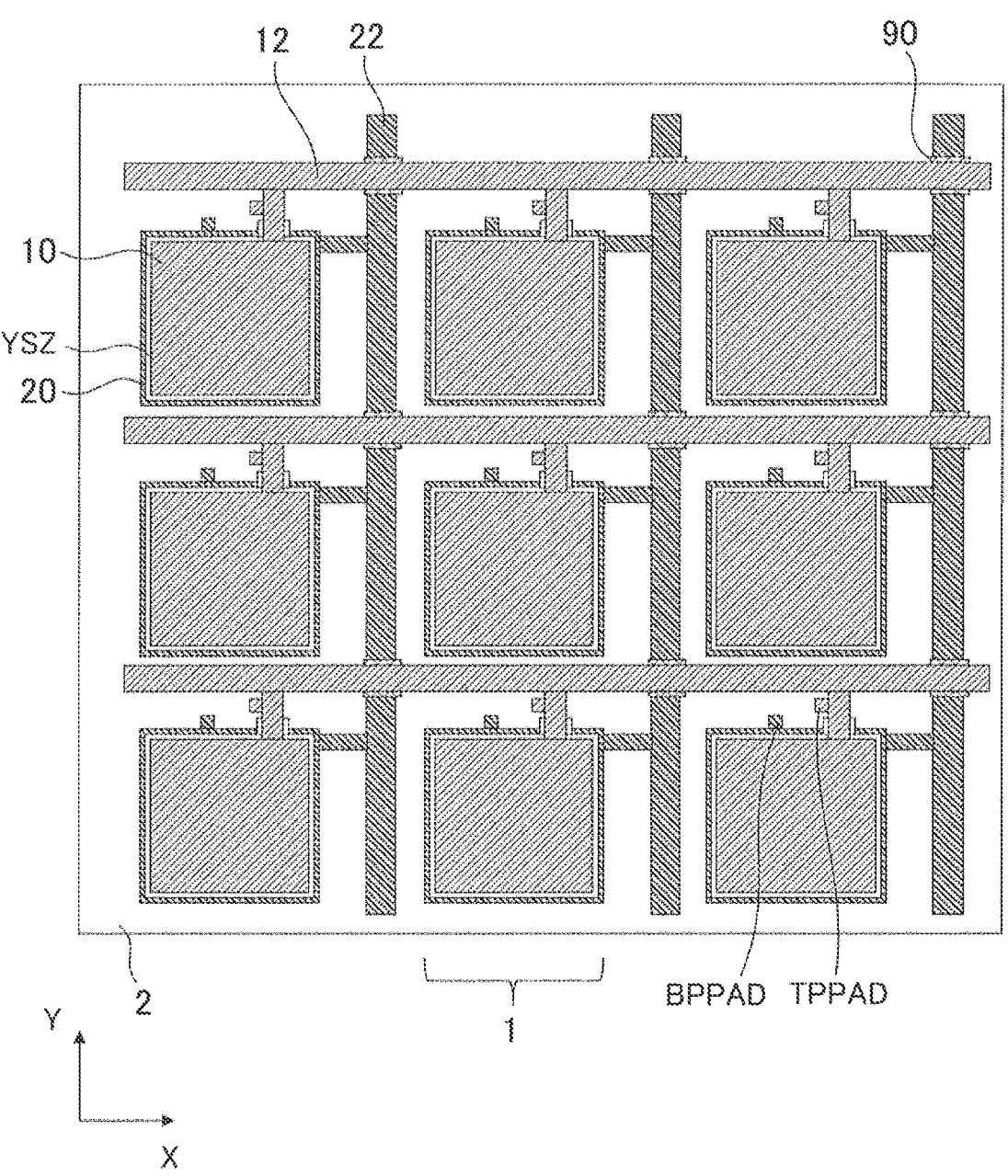
FIG. 6 is an example in which the fuel cells 1 are interconnected.

FIG. 6 is an example in which the fuel cells 1 are interconnected. For example, lower electrode wirings 22 and upper electrode wirings 12 are connected to each other as shown in FIG. 6 to generate electric power. As shown in FIG. 6, it is conceivable to install a lower electrode probe electrode pad BPPAD and an upper electrode probe electrode pad TPPAD in each fuel cell 1 and inspect each fuel cell 1. However, when a short-circuit inspection of individual fuel cells 1 is performed in each of fuel cell arrays connected in parallel with each other by wiring, the cell to be inspected may be determined to be short-circuit failure due to a short-circuit failure other than the inspection target cell as shown in FIG. 7 to be described later.

Figure 7A:
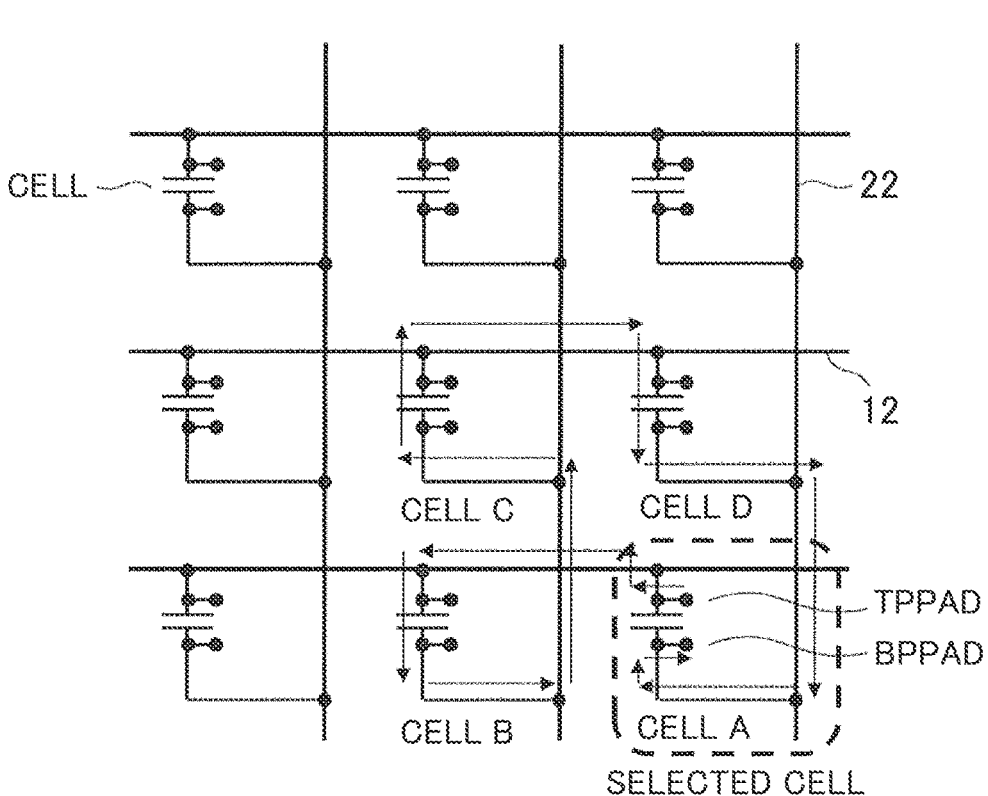
FIG. 7A is a cross-point type array configuration example in which a plurality of upper electrode wirings 12 and a plurality of lower electrode wirings 22 are crossed and each fuel cell is arranged at an intersection.

FIG. 7A is a cross-point type array configuration example in which a plurality of upper electrode wirings 12 and a plurality of lower electrode wirings 22 are crossed and fuel cells are arranged at their intersections. In order to inspect a short-circuit failure of the cell A, a voltage is applied between TPPAD and BPPAD in a state in which the cell A is not generating electricity. If the cell A is not in short-circuit failure, no current should flow through the cell A. However, even if the cell A is not actually short-circuited, a current flows along a path indicated by an arrow where the cell B, cell C, and cell D are all short-circuited. Further, since the current flows through a device connected between TPPAD and BPPAD, it becomes as if the current flows through the cell A, and hence the cell A is determined to be defective.

Figure 7B:
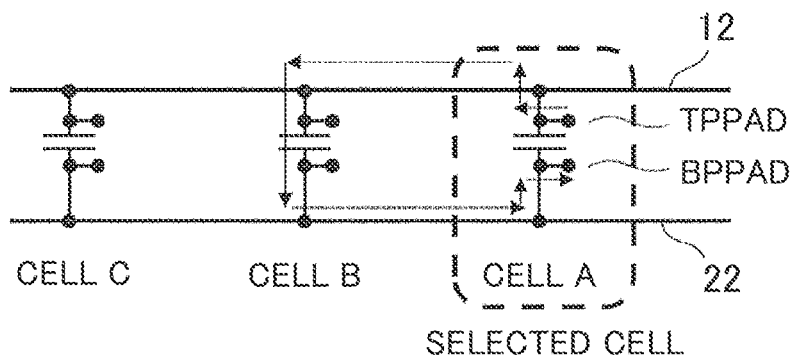
FIG. 7B is an example in which a plurality of cells are connected in parallel between the upper electrode wiring 12 and the lower electrode wiring 22.

FIG. 7B is an example in which a plurality of cells are connected in parallel between the upper electrode wiring 12 and the lower electrode wiring 22. Even if the cell A is not actually short-circuited, a current flows along a path indicated by an arrow where any of the cell B, cell C, and cell D is in short-circuit failure, for example, where the cell B is in short-circuit failure, so that the cell A is determined to be defective.

Such a current that passes through the cell other than the selected cell is called a sneak current. When the short-circuit failure rate is very low, the probability of erroneous determination due to such a sneak current is low, but when the short-circuit failure rate increases, the probability of false detection increases sharply, thus making correct determination difficult.

Figure 8:
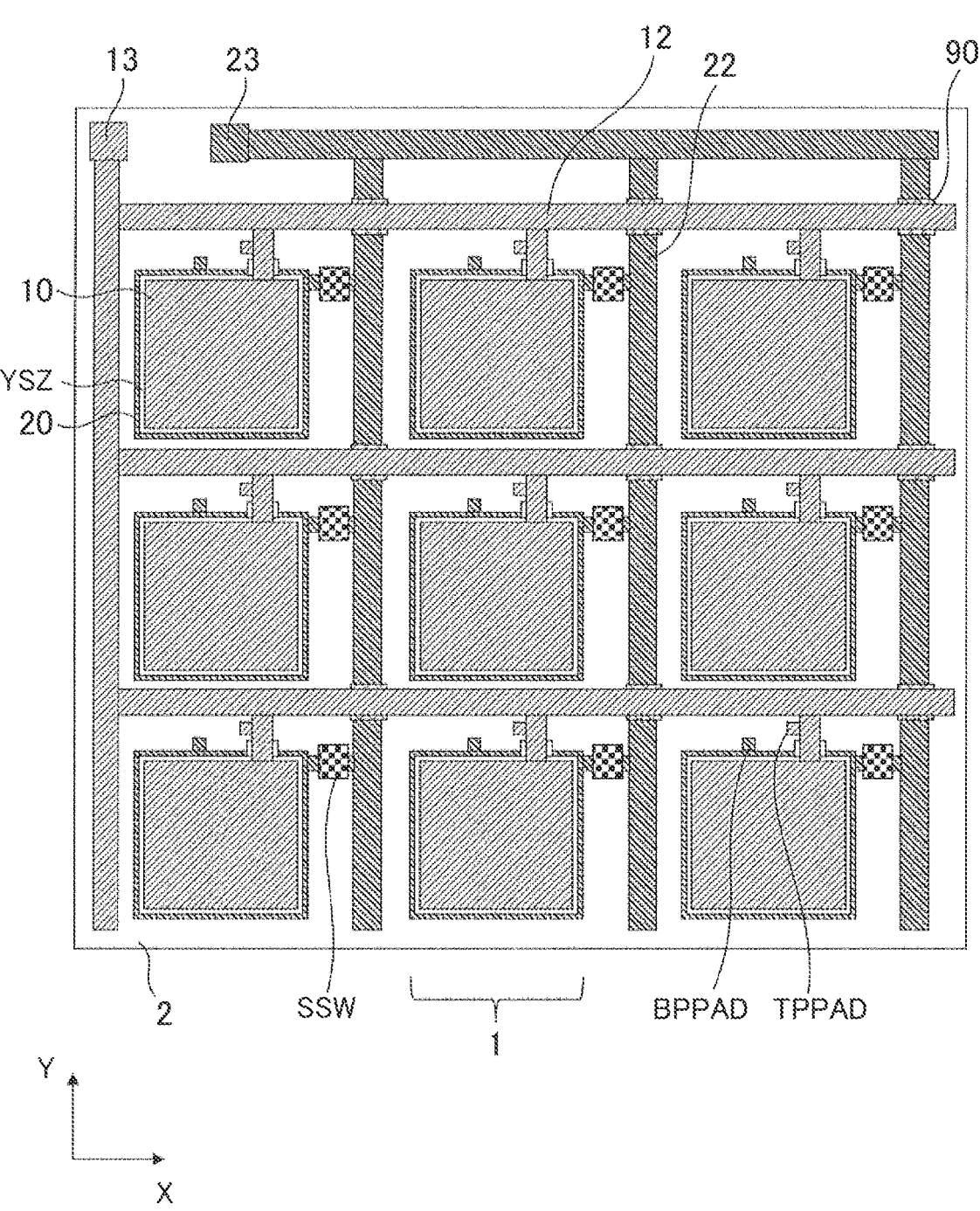
FIG. 8 is a configuration diagram of a fuel cell array according to the first embodiment.

FIG. 8 is a configuration diagram of the fuel cell array according to the first embodiment. In order to suppress the sneak current, a selection switch SSW can be used as shown in FIG. 8. In FIG. 8, the selection switch SSW is formed between the lower electrode wiring 22 and the lower electrode layer 20, but it can also be formed between the upper electrode wiring 12 and the upper electrode layer 10 as will be described later. The selection switch SSW is provided for each fuel cell 1.

Figure 9:
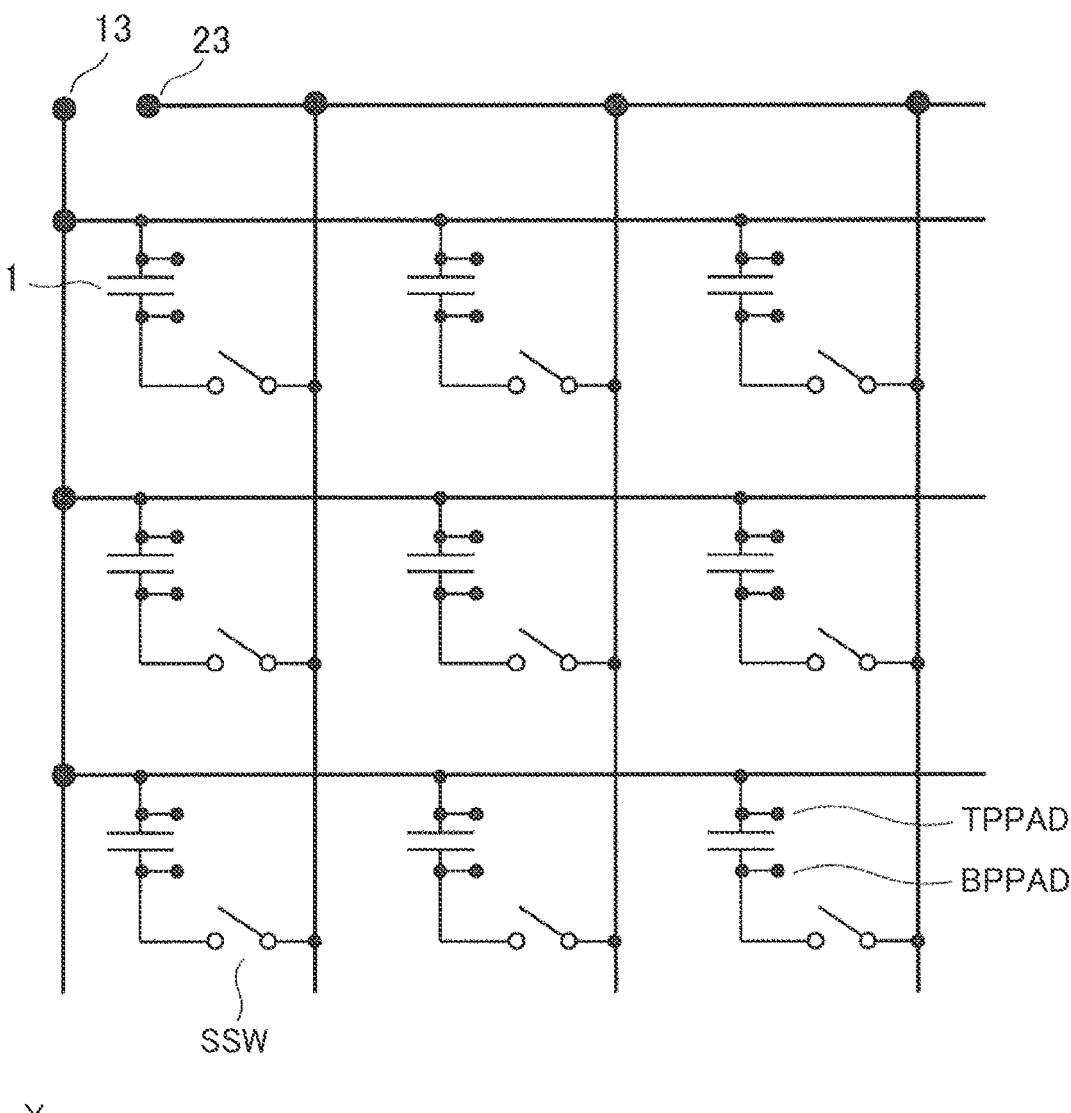
FIG. 9 is an equivalent circuit diagram of FIG. 8.
Figure 9:
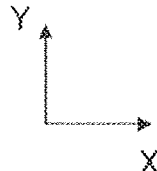

FIG. 9 is an equivalent circuit diagram of FIG. 8. The selected fuel cell 1 can be inspected by applying a voltage between the upper electrode probe electrode pad TPPAD and the lower electrode probe electrode pad BPPAD in a state in which the selection switch SSW is turned off. For example, the upper electrode probe electrode pad TPPAD is set to a ground potential (0V), and a voltage is applied to the lower electrode probe electrode pad BPPAD, so that a current flowing through the lower electrode probe electrode pad BPPAD can be measured.

Figure 10:
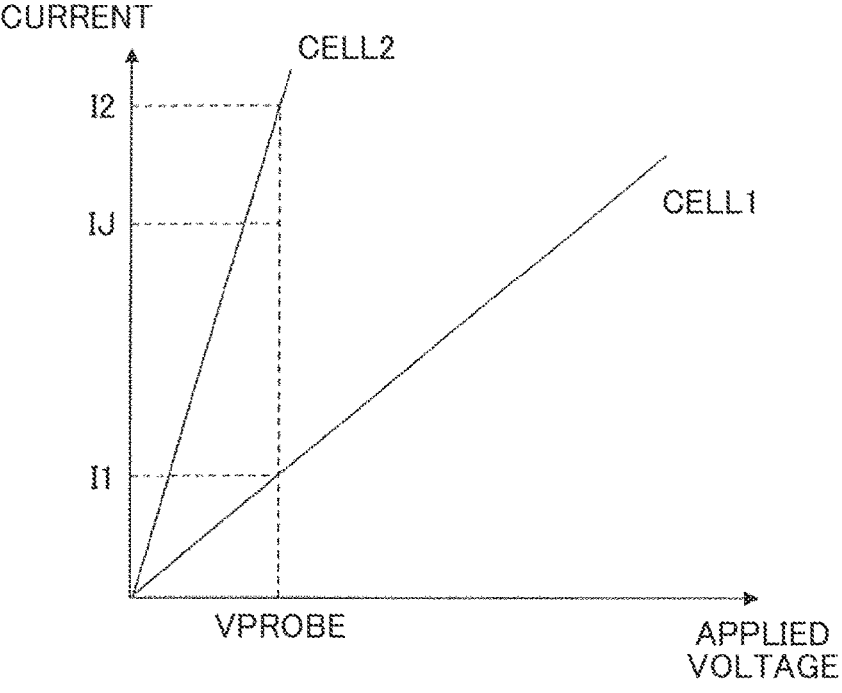
FIG. 10 is an example of a current-voltage characteristic of the fuel cell 1.

FIG. 10 is an example of a current-voltage characteristic of the fuel cell 1. A short-circuit inspection can be performed by acquiring the current-voltage characteristic of the selected fuel cell 1. Celli in FIG. 10 is a non-defective cell and cell 2 in FIG. 10 is a defective cell. It is not necessary to perform a short-circuit inspection for each fuel cell 1 one by one. A voltage is applied to the upper electrode probe electrode pads TPPAD and the lower electrode probe electrode pads BPPAD in a plurality of fuel cells 1 to measure each current, whereby it is also possible to inspect a plurality of fuel cells 1 simultaneously.

Figure 11:
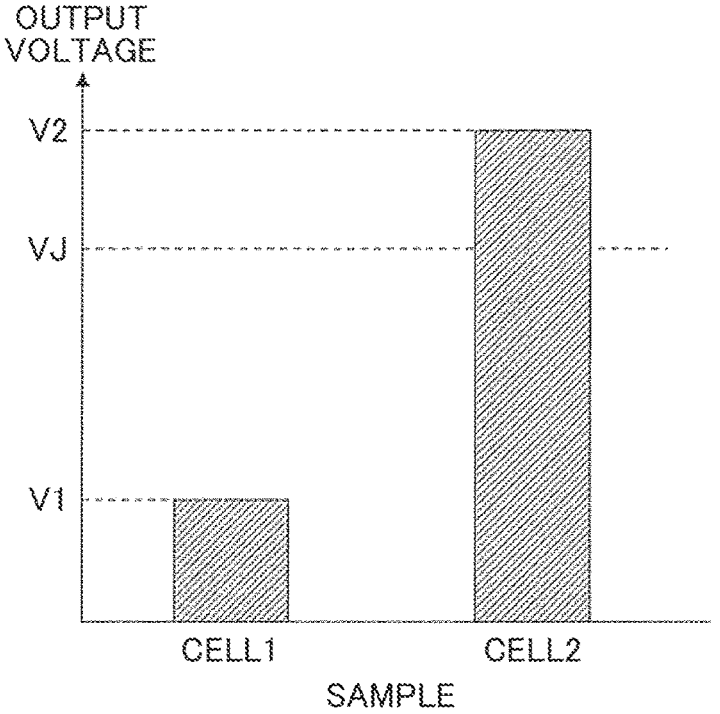
FIG. 11 is an example of an output voltage of the fuel cell 1.

FIG. 11 is an example of the output voltage of the fuel cell 1. Hydrogen is supplied to the anode electrode side of the substrate 2, and air is supplied to the cathode electrode side to raise the temperature to about 200° C. or higher. The output voltage between the upper electrode probe electrode pad TPPAD and the lower electrode probe electrode pad BPPAD is measured as the output voltage of the fuel cell 1. For example, the potential of the lower electrode probe electrode pad BPPAD can be measured by taking the upper electrode probe electrode pad TPPAD as the ground potential (0V). Celli is a defective cell and cell2 is a non-defective cell. To measure the output voltage, it is not necessary to inspect the fuel cells 1 one by one. Further, by measuring the voltage between the upper electrode probe electrode pad TPPAD and the lower electrode probe electrode pad BPPAD in each of a plurality of fuel cells 1, it is also possible to inspect the plurality of fuel cells 1 at the same time.

Upon these inspections, since the selection switch SSW is in the off state, the sneak current does not occur via cells other than selected cell. It is therefore possible to accurately inspect selected cell.

In FIGS. 8 and 9, since the upper electrode probe electrode pad TPPAD is electrically connected to the upper electrode wiring 12, it is not always necessary to form the upper electrode probe electrode pad TPPAD for each fuel cell 1. If it is at a location where it is electrically connected to the upper electrode layer 10, it may be any location of the upper electrode wiring 12 or the upper electrode layer 10 of each cell other than the fuel cell 1 to be inspected. On the other hand, it is important that the lower electrode probe electrode pad BPPAD is formed for each fuel cell 1. By switching the connection with other cells by the selection switch SSW, the inspection can be performed for each fuel cell 1.

When the fuel cell 1 in which a short-circuit failure or an output voltage failure is detected as a result of the inspection is connected in the array, it leads to a reduction in the output power of the entire fuel cell array. When the fuel cells 1 are connected in parallel, a countermeasure can be taken by disconnecting the fuel cell 1 in which the failure is detected from the array. In this case, since the number of fuel cells 1 that contribute to power generation decreases within the fuel cell array, the entire output is reduced. However, if the defective fuel cell 1 can be identified, the number of non-defective cells in the module can be adjusted to be an allowable number when assembling the fuel cell module.

Figure 12A:
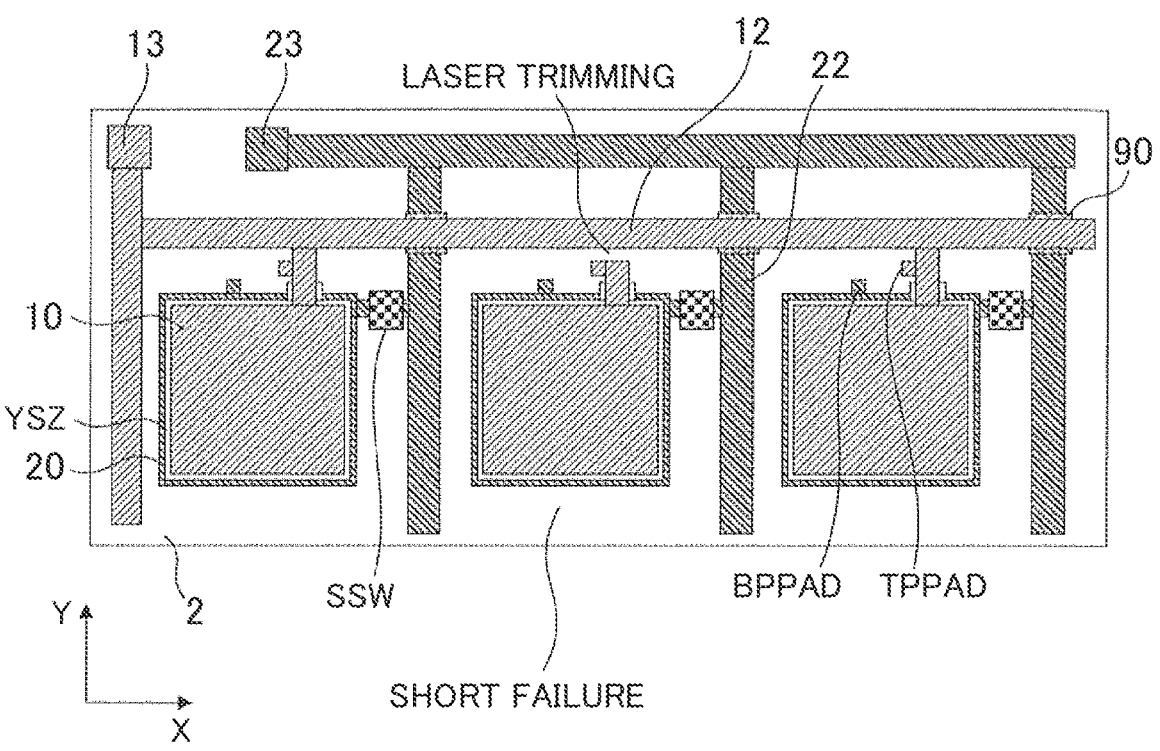
FIG. 12A shows an example in which a cell with a short-circuit failure (ShortFailure) is separated from the upper electrode wiring 12.
Figure 12B:
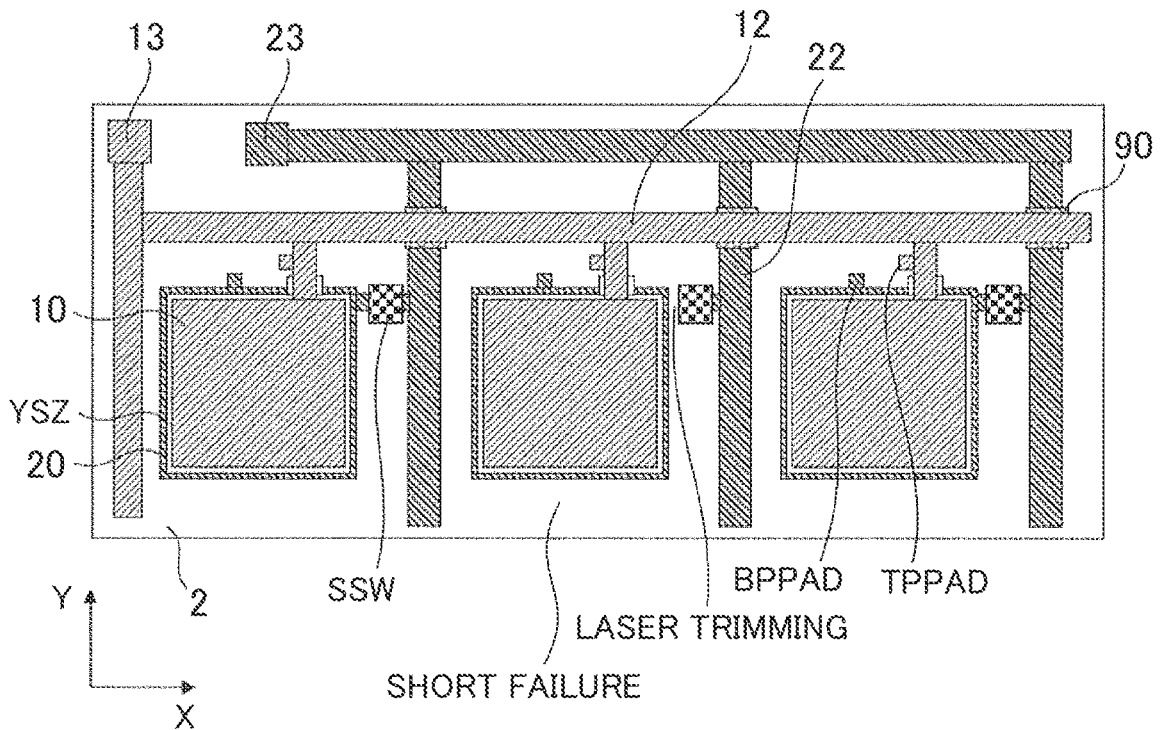
FIG. 12B shows an example in which a cell with a short-circuit failure (ShortFailure) is separated from the lower electrode wiring 22.

FIG. 12A shows an example in which a cell being in short-circuit failure (ShortFailure) is separated from the upper electrode wiring 12. FIG. 12B shows an example in which a cell being in short-circuit failure (ShortFailure) is separated from the lower electrode wiring 22. For example, laser trimming can be used for the separation.

First Embodiment: Configuration of Selection Switch

There are a plurality of candidates for the devices each usable as the selection switch SSW. For example, they include a threshold switch TS, a diode, a field effect transistor FET, and the like. A configuration example of each device will be described below.

Figure 13:
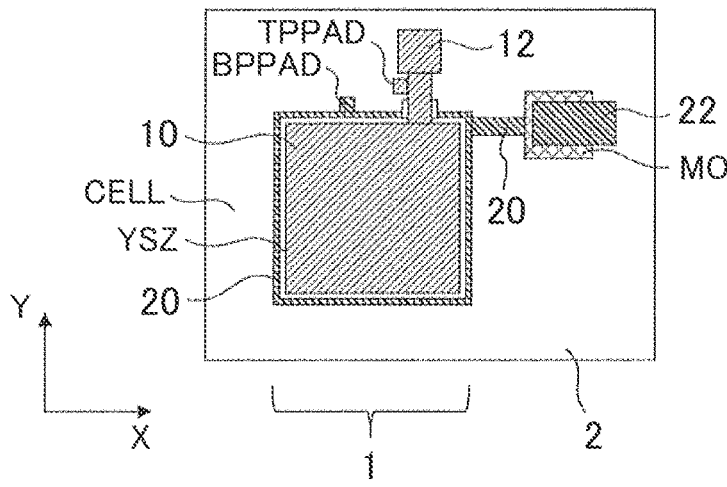
FIG. 13 is an example in which a threshold switch TS is used as a selection switch SSW.
Figure 13:
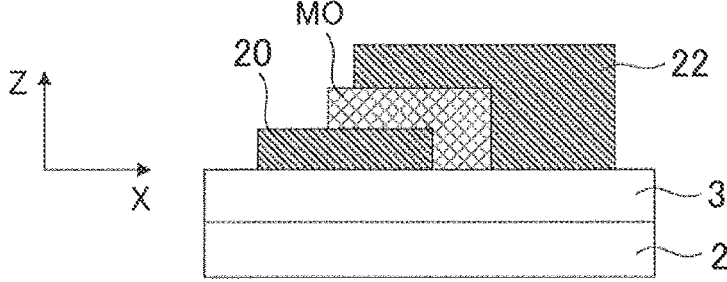
Figure 13:
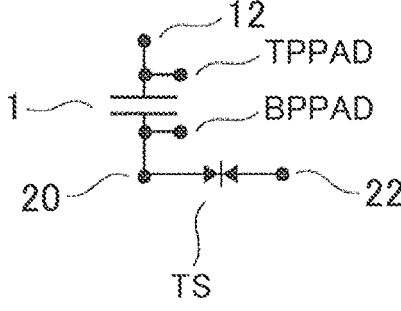

FIG. 13 is an example in which the threshold switch TS is used as the selection switch SSW. The threshold switch TS is a device having a structure in which a thin film metal oxide MO is sandwiched by metal electrodes. A plurality of materials used for the metal electrodes 20 and 22 and the metal oxide MO can be considered. For example, platinum Pt can be used for the metal electrodes 20 and 22, and platinum oxide PtO2 can be used for the metal oxide MO. In addition to platinum, metals such as gold, palladium, iridium, silver, nickel, iron, and tungsten can be used for a metal layer. In addition to platinum oxide, nickel oxide, titanium oxide, cobalt oxide, and the like can also be used for the metal oxide MO.

As a candidate for the metal oxide MO, it operates as a threshold switch TS in combination with the metal electrodes 20 and 22 at the time of inspection, but it is preferable that the metal oxide MO is metallized by annealing treatment executed before its actual use to become a contact low in resistance. This is because the threshold switch TS is necessary upon inspection, but in actual use, it behaves as a parasitic resistor and causes power loss. When the platinum oxide PtO2, nickel oxide, titanium oxide, cobalt oxide or the like is used for the metal oxide MO, the resistance thereof can be reduced by reduction annealing at about 500° C.

Figure 14:
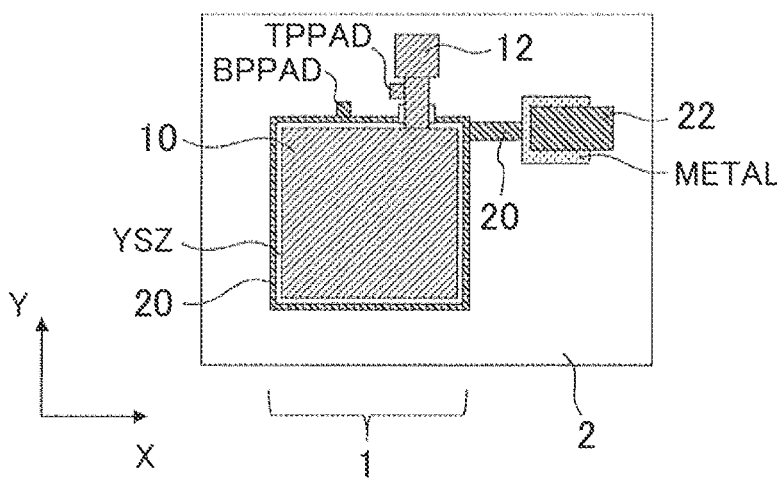
FIG. 14 is a diagram showing a state in which the resistance of a metal oxide MO is lowered by reduction annealing.
Figure 14:
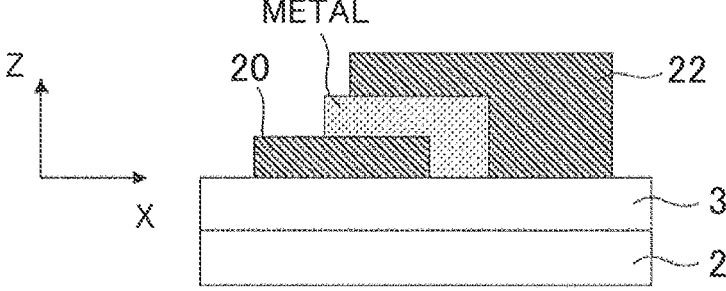
Figure 14:
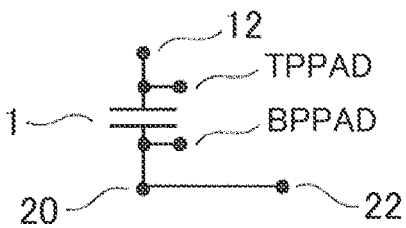

FIG. 14 is a diagram showing a state in which the resistance of the metal oxide MO is reduced by reduction annealing. By reduction annealing, it is possible to eliminate the influence of the threshold switch TS, which becomes unnecessary during power generation. If at least a part of the metal oxide MO is reduced and metallized to allow conduction between the metal electrodes 20 and 22, a state equivalent to that in FIG. 14 is obtained. The reduced metal oxide MO may become a porous metal layer due to volumetric shrinkage. Thus, in the layer between the metal electrodes 20 and 22 in FIG. 14, (a) a part thereof is reduced to become a metal layer, and the remaining part thereof remains as the metal oxide MO, or (b) the whole thereof is reduced to become a porous metal layer.

Depending on the material of the metal oxide MO to be used, the threshold switch TS whose resistance is lowered by reduction annealing may become higher resistance again when exposed to a high-temperature oxidizing atmosphere. For example, when the platinum oxide PtO2 is used for the metal oxide MO, such high resistance does not occur. Therefore, even if the threshold switch TS is used on the cathode side and exposed to high-temperature air during power generation, the resistance remains low. In this case, the threshold switch TS can also be installed on the cathode electrode side or installed on the anode side.

On the other hand, when nickel oxide, titanium oxide, cobalt oxide, etc. are used for the metal oxide MO, the resistance may increase again when exposed to a high-temperature oxidizing atmosphere. There is no problem if the temperature is low, but if there is a risk of oxidation due to the atmosphere on the cathode side at the actual operating temperature of the fuel cell, it is desirable to install the threshold switch TS using these metal oxides on the anode side.

Figure 15:
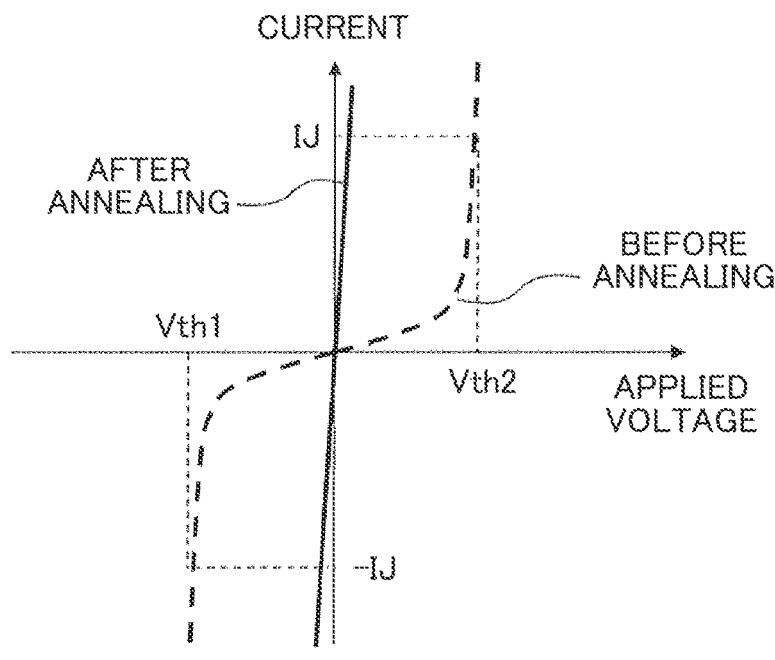
FIG. 15 shows current-voltage characteristics of the threshold switch TS both before and after reduction annealing.

FIG. 15 shows current-voltage characteristics of the threshold switch TS both before and after reduction annealing. Before annealing, the threshold switch shows a current-voltage characteristic which is non-linear with respect to the applied voltage. After annealing, it becomes an almost ohmic low resistance contact.

Before annealing, when the applied voltage is small, almost no current flows, but on the other hand, when the applied voltage exceeds a threshold voltage, the current increases sharply. It is possible to perform a short-circuit inspection of the fuel cell 1 by setting the upper electrode probe electrode pad TPPAD as the ground potential (0V) and applying a potential less than or equal to the threshold voltage of the threshold switch TS to the lower electrode probe electrode pad BPPAD to obtain a current-voltage characteristic.

Before annealing, hydrogen is supplied to the anode electrode side of the substrate 2, and air is supplied to the cathode electrode side to raise the temperature to about 200° C. or higher. And the upper electrode probe electrode pad TPPAD is set to the ground potential (0V), and the output voltage between the upper electrode probe electrode pad TPPAD and the lower electrode probe electrode pad BPPAD is measured, whereby the output voltage of the fuel cell 1 can be determined.

Figure 16:
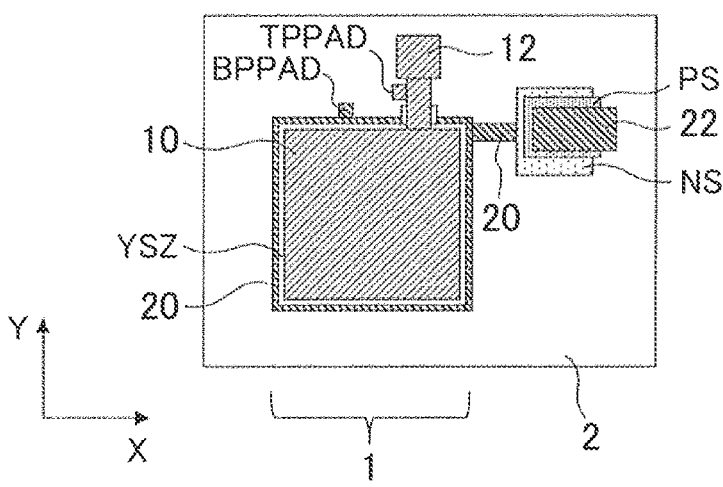
FIG. 16 is an example in which a diode is used as the selection switch SSW.
Figure 16:
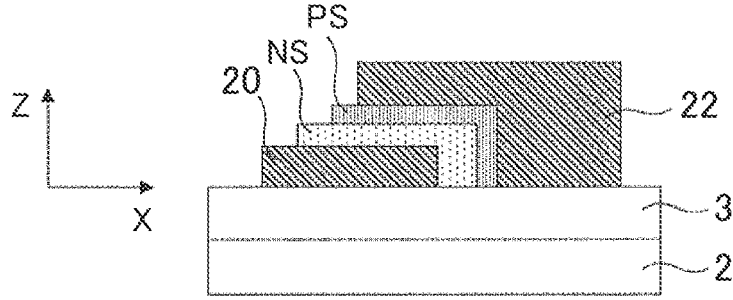
Figure 16:
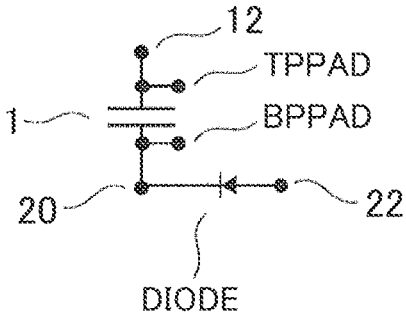

FIG. 16 is an example in which a diode is used as the selection switch SSW. The diode can be manufactured by sequentially stacking an N-type semiconductor NS and a P-type semiconductor PS on the upper layer of a lower electrode layer 20 and forming a lower electrode wiring 22 on the upper layer of the P-type semiconductor. On the circuit diagram, the forward direction of the diode serves as the direction from the lower electrode wiring 22 toward the lower electrode layer 20. When the order of film deposition of the N-type semiconductor NS and the P-type semiconductor PS is reversed, the forward direction of the diode becomes the opposite direction. The diode is manufactured so that the forward direction of the diode becomes the same as the direction of power generation of the fuel cell in actual use.

By setting the upper electrode probe electrode pad TPPAD to the ground potential (0V) and applying a potential to the lower electrode probe electrode pad BPPAD to obtain a current-voltage characteristic, a short-circuit inspection of the fuel cell 1 can be performed. The potential is applied to the lower electrode probe electrode pad BPPAD in consideration of the polarity so that a forward voltage is not applied to the diode during the inspection.

Hydrogen is supplied to the anode electrode side of the substrate 2, and air is supplied to the cathode electrode side to raise the temperature to about 200° C. or higher. The upper electrode probe electrode pad TPPAD is set to the ground potential (0V), and the potential of the lower electrode probe electrode pad BPPAD is measured, so that the output voltage can be determined. It is preferable to apply a potential of about the maximum value of the output voltage to the lower electrode wiring 22 so that the forward voltage is not applied to the diode during the inspection. Even if the output voltage of the fuel cell 1 is 0V, a reverse bias is applied to the diode, so that the potential of the lower electrode probe electrode pad BPPAD can be measured without being affected by the potential applied to the lower electrode wiring 22.

As the combination of the N-type semiconductor NS and the P-type semiconductor PS, for example, N-type polysilicon in which phosphorus is doped in the N-type semiconductor NS and P-type polysilicon in which boron is doped in the P-type semiconductor PS can be used. Titanium oxide can be used for the N-type semiconductor NS, and nickel oxide can be used for the P-type semiconductor PS.

It is desirable that the parasitic resistance of the diode in actual use becomes small. Since the diode is not required in actual use, the resistance may be lowered by an irreversible change due to annealing as in the threshold switch TS of FIG. 14. In this case, the N-type semiconductor NS and the P-type semiconductor PS take any of (a) some thereof is formed into metal wiring that conducts between the metal electrodes 20 and 22, and the rest thereof remains as the semiconductor layer, (b) the whole becomes a porous metal wiring that conducts between the metal electrodes 20 and 22, and (c) carriers are diffused between the N-type semiconductor NS and the P-type semiconductor PS to make conduction between the metal electrodes 20 and 22.

Figure 17:
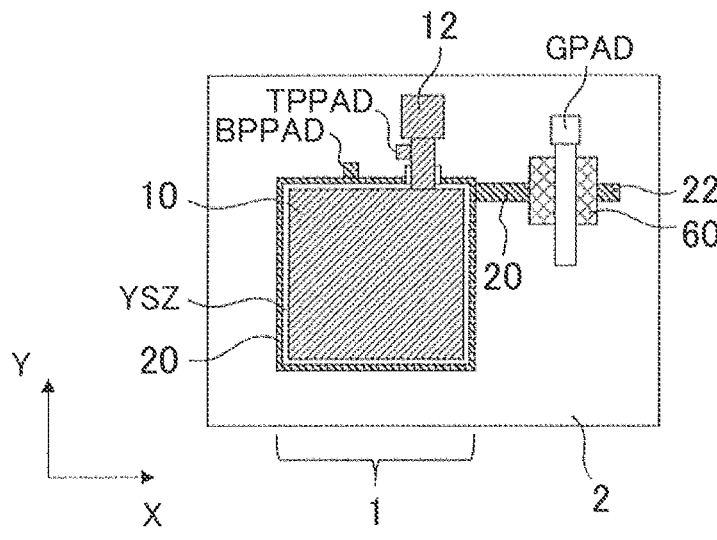
FIG. 17 is an example in which a field effect transistor FET is used as the selection switch SSW.
Figure 17:
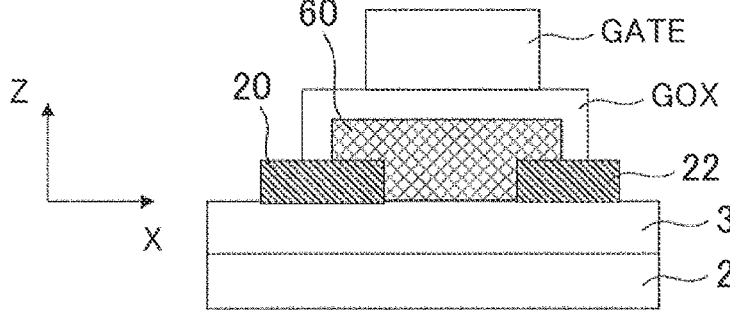
Figure 17:
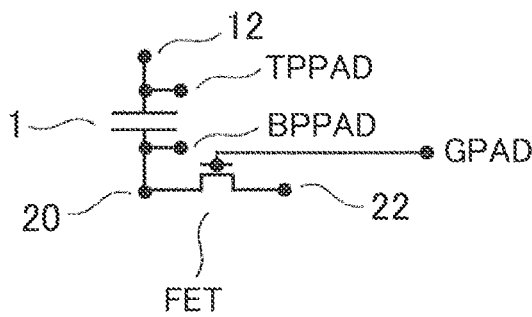

FIG. 17 is an example in which a field effect transistor FET is used as the selection switch SSW. The field effect transistor FET can be manufactured by forming a channel semiconductor layer 60 on the upper layers of parts of the lower electrode layer 20 and the lower electrode wiring 22 and forming a gate insulating film GOX and a gate GATE thereon. As the channel semiconductor layer 60, for example, N-type polysilicon doped with low-concentration phosphorus, P-type polysilicon doped with low-concentration boron, and the like can be used.

It is desirable that the field effect transistor FET is manufactured so as to be an on state when 0V is applied to the gate GATE. Thus, when 0V is applied to the gate during the actual use, the field effect transistor FET can be turned on to generate electricity.

In a state in which the field effect transistor FET is made into an off state by applying an off voltage (negative voltage in the case of an N-type FET, positive voltage in the case of a P-type FET) to the gate, the upper electrode probe electrode pad TPPAD is set to the ground potential (0V), and a potential is applied to the lower electrode probe electrode pad BPPAD to obtain a current-voltage characteristic, whereby a short-circuit inspection of the fuel cell 1 can be performed.

Hydrogen is supplied to the anode electrode side of the substrate 2, and air is supplied to the cathode electrode side to raise the temperature to about 200° C. or higher. And the upper electrode probe electrode pad TPPAD is set to the ground potential (0V), and the potential between the upper electrode probe electrode pad TPPAD and the lower electrode probe electrode pads BPPAD is measured, thereby making it possible to determine the output voltage.

It is desirable that the parasitic resistance of the field effect transistor FET in actual use becomes small. Since the field effect transistor FET is not required in actual use, the resistance of the channel semiconductor layer 60 may be lowered by an irreversible change due to annealing as in the threshold switch TS of FIG. 14. In this case, the channel semiconductor layer 60 takes either (a) some thereof is made into metal wiring that conducts between the metal electrodes 20 and 22, and the rest thereof remains as the semiconductor layer, or (b) the whole thereof becomes porous metal wiring that conducts between the metal electrodes 20 and 22.

Figure 18:
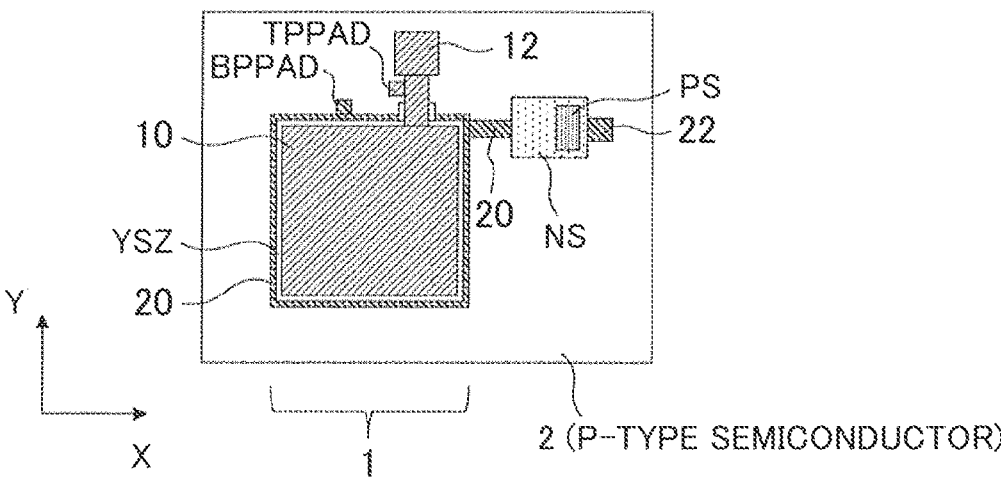
FIG. 18 is an example in which a diode is created in a substrate 2 as the selection switch SSW.
Figure 18:
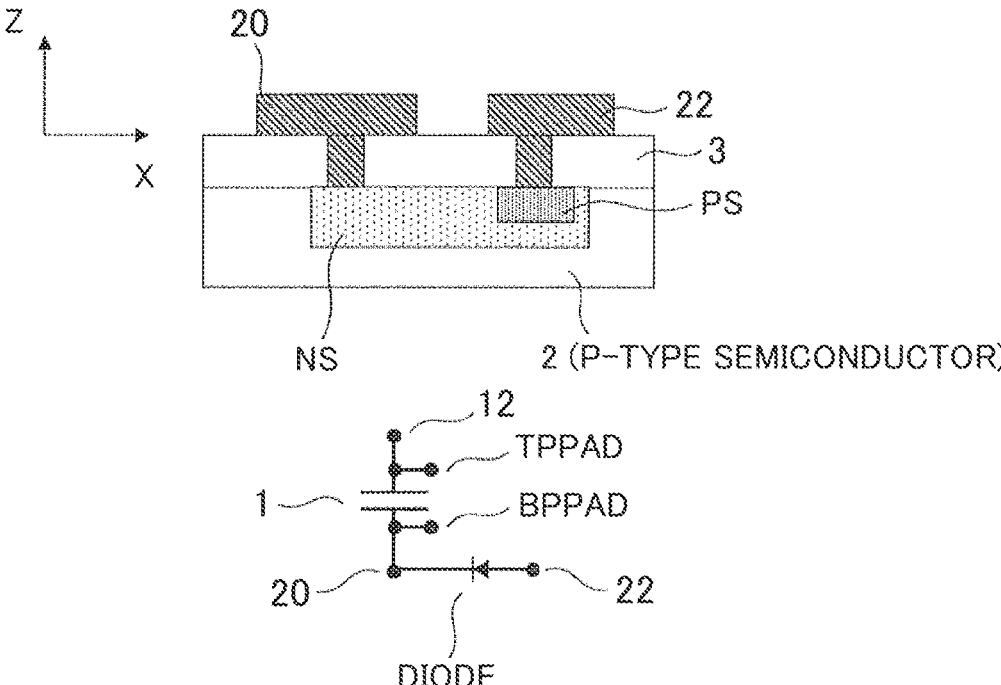

FIG. 18 is an example in which a diode is fabricated in the substrate 2 as the selection switch SSW. When the diode is manufactured in the substrate 2, the regions of the N-type semiconductor NS and the P-type semiconductor PS are formed in the substrate 2, and a contact is formed from each of the lower electrode layer 20 and the lower electrode wiring 22. When the substrate 2 is the P-type semiconductor, the P-type semiconductor region PS is formed inside the N-type semiconductor region NS as shown in FIG. 18. When the substrate 2 is the N-type semiconductor, the N-type semiconductor region NS is formed inside the P-type semiconductor region PS.

In the circuit diagram of FIG. 18, the forward direction of the diode becomes the direction from the lower electrode wiring 22 toward the lower electrode layer 20. This is because the P-type semiconductor region PS is in contact with the lower electrode wiring 22, and the N-type semiconductor region NS is in contact with the lower electrode layer 20. When the N-type semiconductor region NS is formed to contact with the lower electrode wiring 22, and the P-type semiconductor region PS is formed to contact with the lower electrode layer 20, the forward direction of the diode is reversed. The diode is manufactured so that the forward direction of the diode is the same as the direction of power generation of the fuel cell in actual use.

By applying a potential difference between the upper electrode probe electrode pad TPPAD and the lower electrode probe electrode pad BPPAD to obtain a current-voltage characteristic, a short-circuit inspection of the fuel cell 1 can be performed. Hydrogen is supplied to the anode electrode side of the substrate 2, and air is supplied to the cathode electrode side to raise the temperature to about 200° C. or higher. And the output voltage between the upper electrode probe electrode pad TPPAD and the lower electrode probe electrode pad BPPD is measured, whereby the output voltage can be determined.

Figure 19:
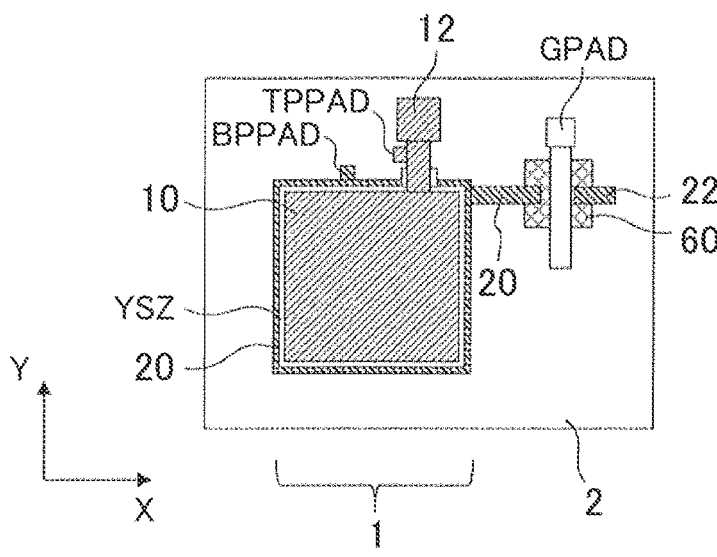
FIG. 19 is an example in which a field effect transistor FET is created in the substrate 2 as the selection switch SSW.
Figure 19:
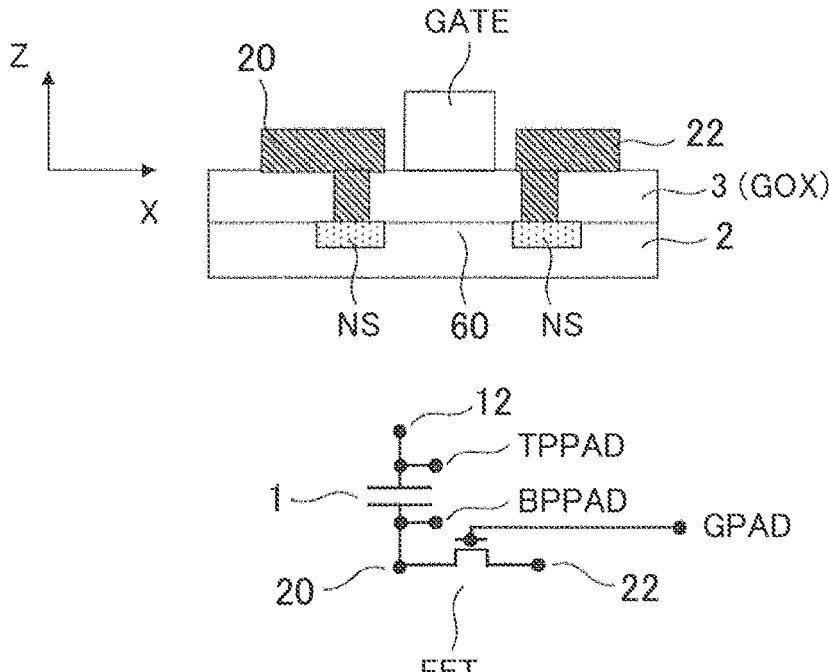

FIG. 19 shows an example in which a field effect transistor FET is fabricated in the substrate 2 as the selection switch SSW. When the field effect transistor FET is manufactured in the substrate 2, two N-type semiconductor regions NS are formed in the substrate 2, and an insulating film 3 to be a gate insulating film GOX is formed on the substrate 2. A gate GATE is formed on the gate insulating film GOX. Further, a contact from the lower electrode layer 20 and a contact from the lower electrode wiring 22 are formed for the two N-type semiconductor regions NS respectively. Instead of the two N-type semiconductor regions NS, two P-type semiconductor regions PS can also be formed. When the N-type semiconductor region NS is formed, an N-type FET is manufactured, and when the P-type semiconductor region PS is formed, a P-type FET is manufactured.

It is desirable to manufacture the field effect transistor FET so that it is brought into an on state when 0V is applied to the gate GATE. In the case of the N-type FET, the surface of the substrate 2 between channel semiconductor layers NS may be subjected to N-type doping. In the case of the P-type FET, the surface of the substrate 2 between channel semiconductor layers PS may be subjected to P-type doping. By applying 0V to the gate during actual use, the field effect transistor FET is brought into the on state so that it is possible to cause the fuel cell 1 to generate electricity.

In a state in which the field effect transistor FET is made into an off state by applying an off voltage (negative voltage in the case of the N-type FET, positive voltage in the case of the P-type FET) to the gate, a potential difference is applied between the upper electrode probe electrode pad TPPAD and the lower electrode probe electrode pas BPPAD to obtain a current-voltage characteristic, whereby a short-circuit inspection of the fuel cell 1 can be performed. Hydrogen is supplied to the anode electrode side of the substrate 2, and air is supplied to the cathode electrode side to raise the temperature to about 200° C. or higher. And the output voltage between the upper electrode probe electrode pad TPPAD and the lower electrode probe electrode pad BPPAD is measured, thereby making it possible to determine the output voltage.

Figure 20:
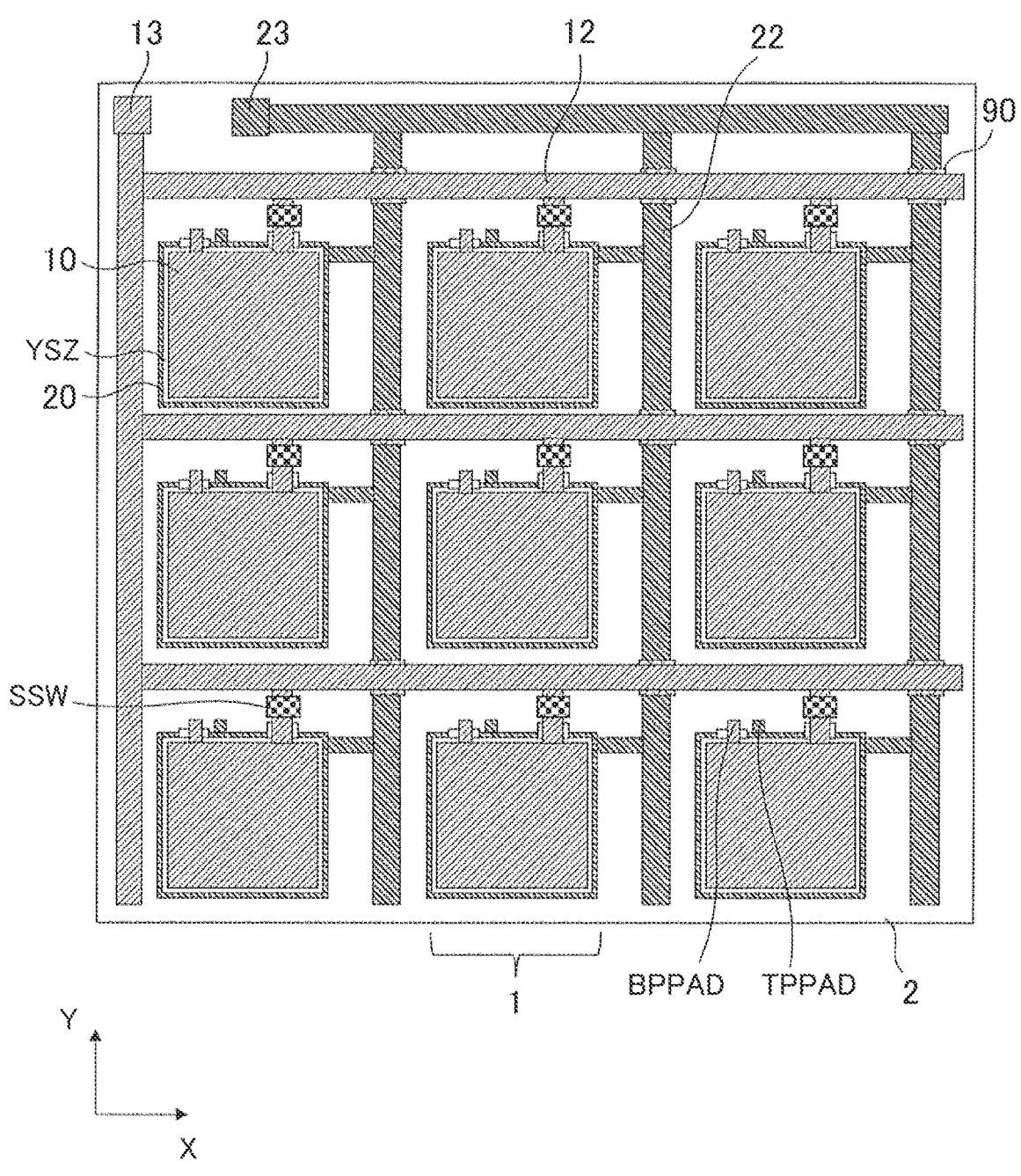
FIG. 20 is an example in which the selection switch SSW is formed between the upper electrode wiring 12 and an upper electrode layer 10.

FIG. 20 is an example in which the selection switch SSW is formed between the upper electrode wiring 12 and the upper electrode layer 10. Up to this point, description has been made about the case where the selection switch SSW is formed between the lower electrode wiring 22 and the lower electrode layer 20, but of course, it is also possible to make it as shown in FIG. 20.

Figure 21:
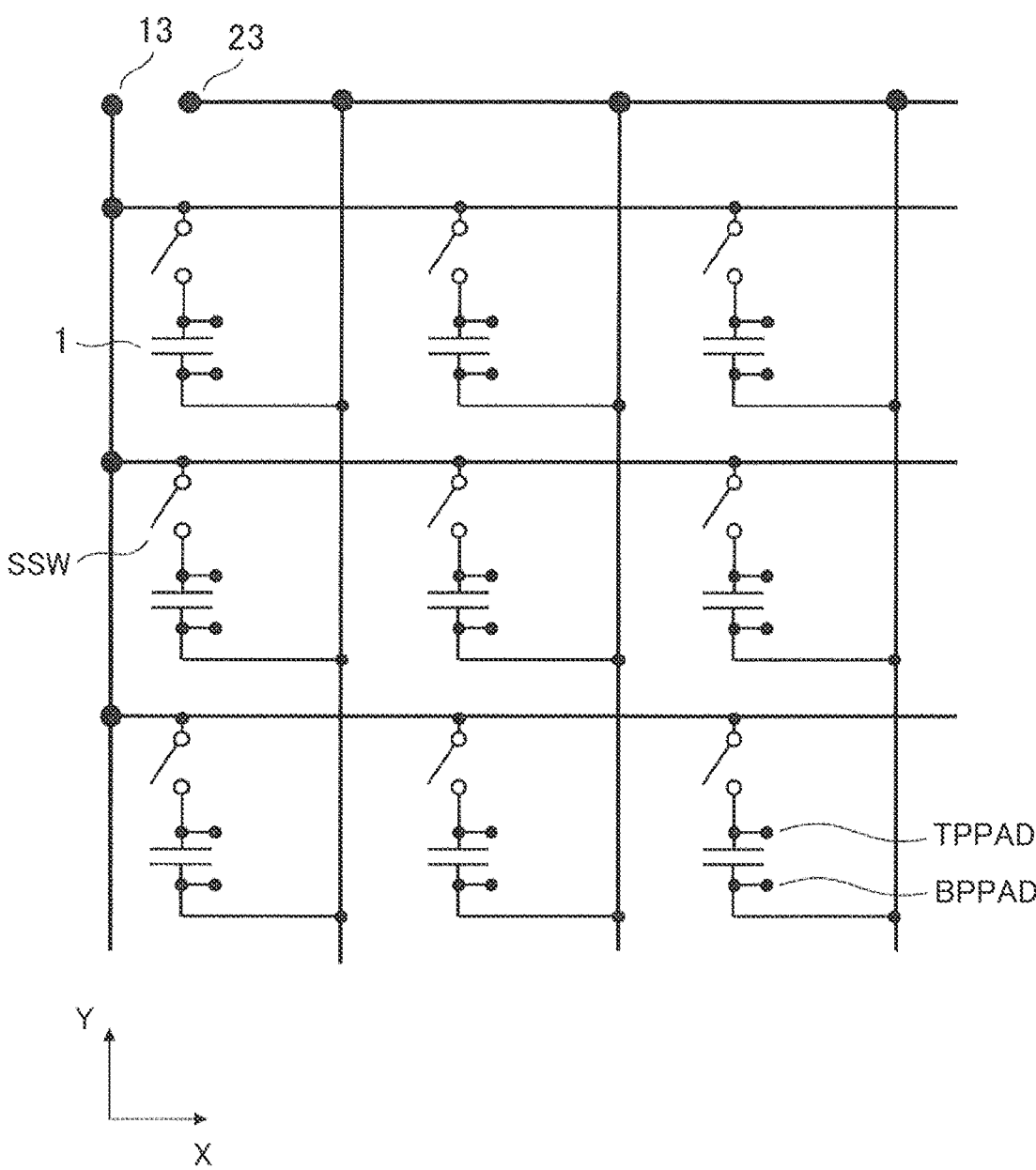
FIG. 21 is an equalization circuit diagram of FIG. 20.

FIG. 21 is an equalization circuit diagram of FIG. 20. Such configurations as shown in FIGS. 20 and 21 can also realize the same operations and effects as the configurations of the first embodiment described above.

In FIGS. 20 and 21, since the lower electrode probe electrode pad BPPAD is electrically connected to the lower electrode wiring 22, it does not necessarily have to be formed for each fuel cell 1. As long as the lower electrode probe electrode pad is electrically connected to the lower electrode layer 20, it may be any location of the lower electrode wiring 22 or may be connected to the lower electrode layer 20 of the cell other than the fuel cell 1 to be inspected. It is important that the upper electrode probe electrode pad TPPAD is formed for each fuel cell 1.

Figure 22:
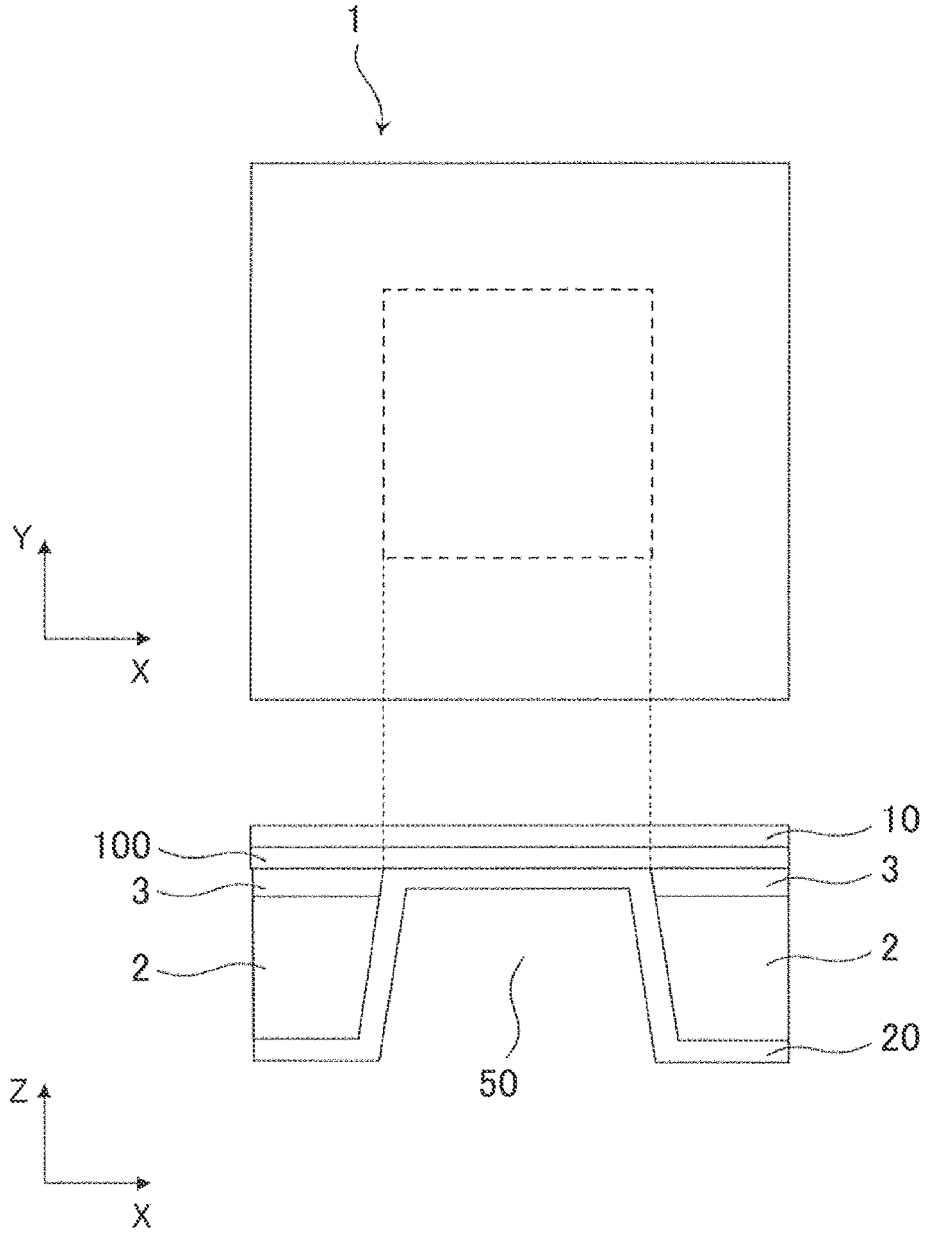
FIG. 22 is a configuration example of the fuel cell 1 in which a lower electrode layer 20 is formed on the back surface side of the substrate 2.

FIG. 22 is a configuration example of a fuel cell 1 in which a lower electrode layer 20 is formed on the back surface side of a substrate 2. In FIG. 22, a solid electrolyte layer 100 (YSZ) is formed on an insulating film 3 formed on the substrate 2, and an upper electrode layer 10 is formed on the solid electrolyte layer 100. Further, the lower electrode layer 20 is formed from the back surface side of the substrate 2 through an opening 50 formed in the substrate 2.

Figure 23:
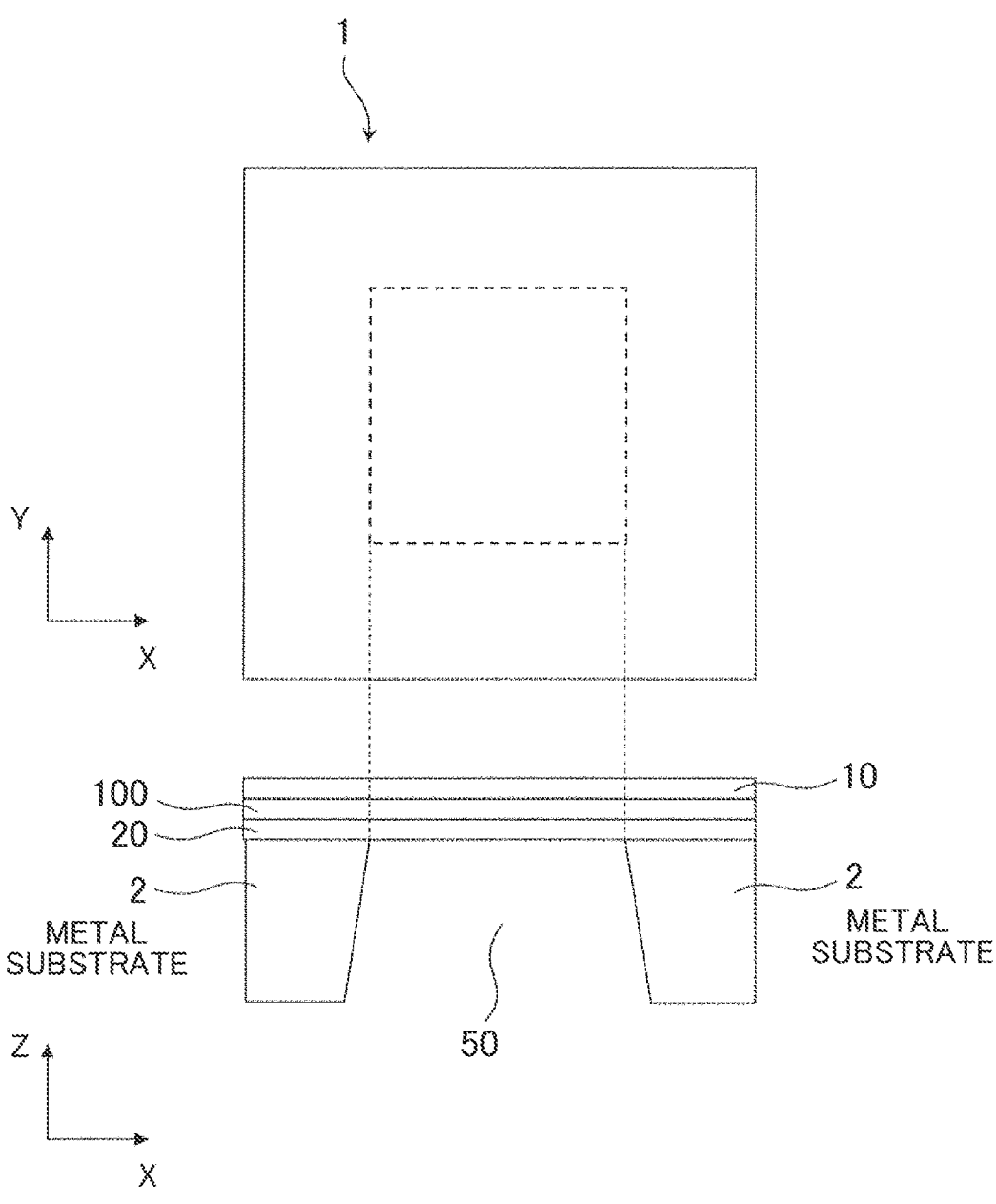
FIG. 23 is another configuration example of the fuel cell 1 in which the lower electrode layer 20 is formed on the back surface side of the substrate 2.

FIG. 23 is another configuration example of a fuel cell 1 in which a lower electrode layer 20 is formed on the back surface side of a substrate 2. In FIG. 23, the lower electrode layer 20 is formed on the metal substrate 2, a solid electrolyte layer 100 (YSZ) is formed on the lower electrode layer 20, and an upper electrode layer 10 is further formed on the solid electrolyte layer 100 (YSZ).

The fuel cell 1 as shown in FIG. 22 or 23 can also be used for producing such a fuel cell array as described in FIGS. 2 to 21 and assembling a fuel cell module.

First Embodiment: Effect

Figure 24:
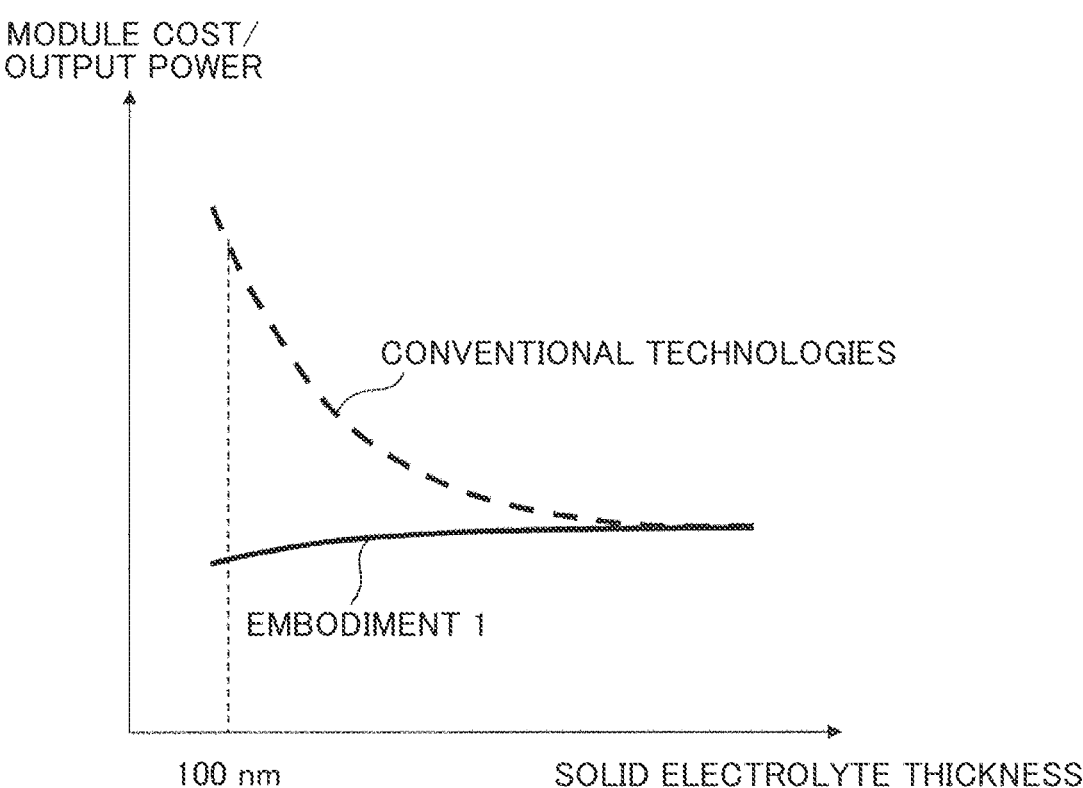
FIG. 24 is a diagram describing the effect of the first embodiment.

FIG. 24 is a diagram describing the effect of the present first embodiment. When the solid electrolyte layer 100 is thinned in order to improve the power generation performance, the probability of the short-circuit failure and the accompanying output voltage failure increases. Consequently, the probability that the defective fuel cell 1 is included in the fuel cell array increases. Unless the defective cells are inspected and countermeasures using the result thereof are taken, the fuel cell module is made frequently defective due to the cells in failure in the fuel cell array, thus increasing the cost. Despite the improvement in power generation performance, the module cost per power (Module cost/output power) is increased by thinning of the solid electrolyte layer 100.

With the use of the technique of the present first embodiment, even if the probability of cells in failure increases due to the thinning of the solid electrolyte layer 100, the cells in failure can be separated. Consequently, since the number of fuel cells 1 required for the module is increased, the cost itself is increased. However, since the output power is improved by thinning of the solid electrolyte layer 100, the module cost per power (Module cost/output power) can be reduced. Thus, the technique of the present first embodiment is effective in order to utilize the merits of thinning the solid electrolyte layer 100.

Second Embodiment

In the first embodiment, the lower electrode probe electrode pad BPPAD and the upper electrode probe electrode pad TPPAD are installed in each fuel cell 1 in the fuel cell array. The position of the electrode pad is not limited to this, and one lower electrode probe electrode pad BPPAD may be installed in the lower electrode wiring 22 to which a plurality of fuel cells 1 are connected, and one upper electrode probe electrode pad TPPAD may be installed in the upper electrode wiring 12. In the second embodiment of the present invention, a configuration example thereof will be described.

Figure 25:
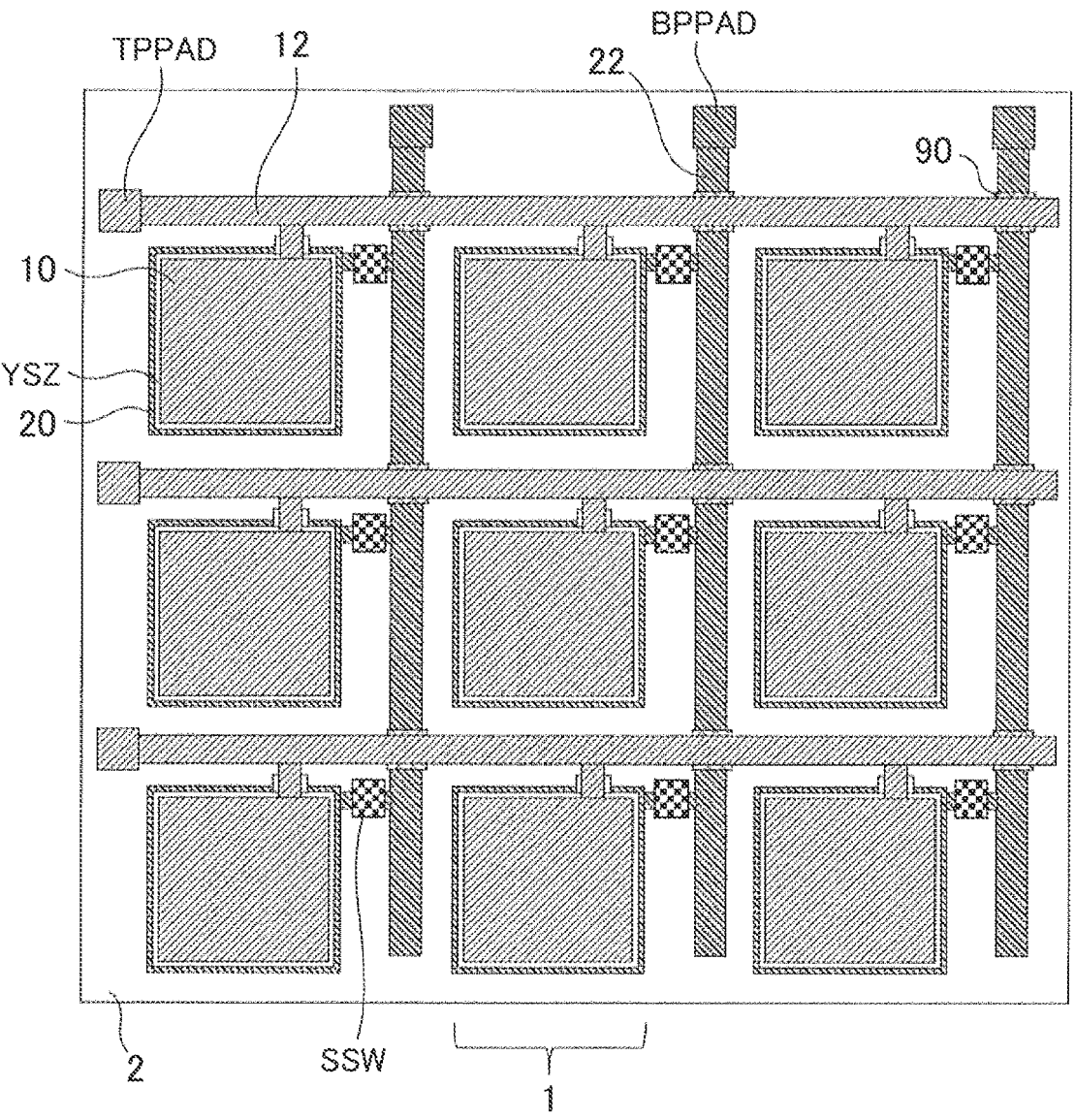
FIG. 25 shows a fuel cell array in which a plurality of upper electrode wirings 12 and a plurality of lower electrode wirings 22 are crossed and arranged, and a fuel cell 1 is arranged at each intersection.

FIG. 25 shows a fuel cell array in which a plurality of upper electrode wirings 12 and a plurality of lower electrode wirings 22 are crossed and arranged, and a fuel cell 1 is arranged at each intersection. A selection switch SSW is arranged between the lower electrode wiring 22 and a lower electrode layer 20. Unlike the first embodiment, the lower electrode probe electrode pad BPPAD is arranged at the end of the lower electrode wiring 22, and the upper electrode probe electrode pad TPPAD is arranged at the end of the upper electrode wiring 12.

Figure 26:
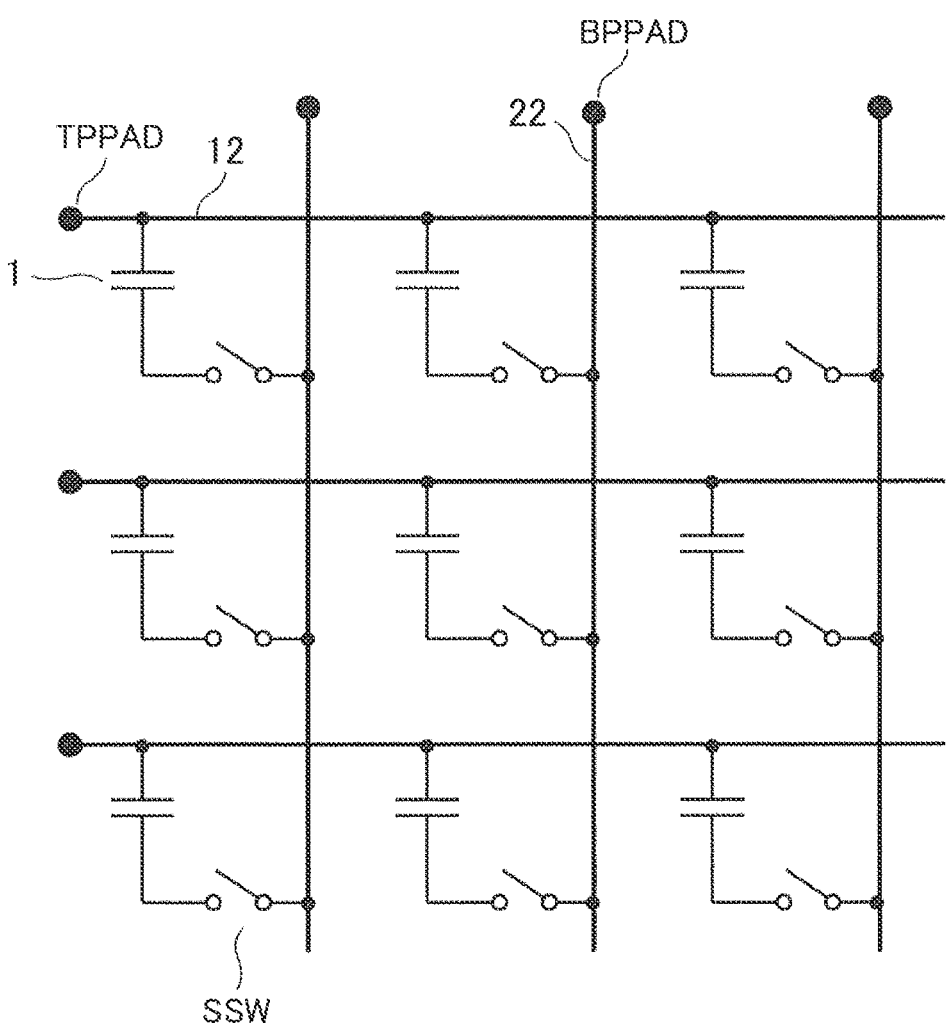
FIG. 26 is an equivalent circuit diagram of FIG. 25.

FIG. 26 is an equivalent circuit diagram of FIG. 25. The selection switch SSW of the selected cell is brought into an on state, the selection switch SSW of the fuel cell 1 which is not selected is brought into an off state, and a voltage is applied between the lower electrode probe electrode pad BPPAD and the upper electrode probe electrode pad TPPAD, so that a short-circuit inspection of the fuel cell 1 can be performed.

The selection switch SSW of the selected cell is brought into an on state, and the selection switch SSW of the fuel cell 1 which is not selected is brought into an off state. Hydrogen is supplied to the anode electrode side of a substrate 2 and air is supplied to the cathode electrode side to raise the temperature to about 200° C. or higher, and the output voltage between the upper electrode probe electrode pad TPPAD and the lower electrode probe electrode pad BPPAD is measured, so that the output voltage of the fuel cell 1 can be determined.

At the time of these inspections, since the selection switch SSW of each fuel cell 1 other than the selected cell is in the off state, no sneak current occurs through the cells other than the selected cell. It is therefore possible to accurately inspect the selected cell.

Figure 27A:
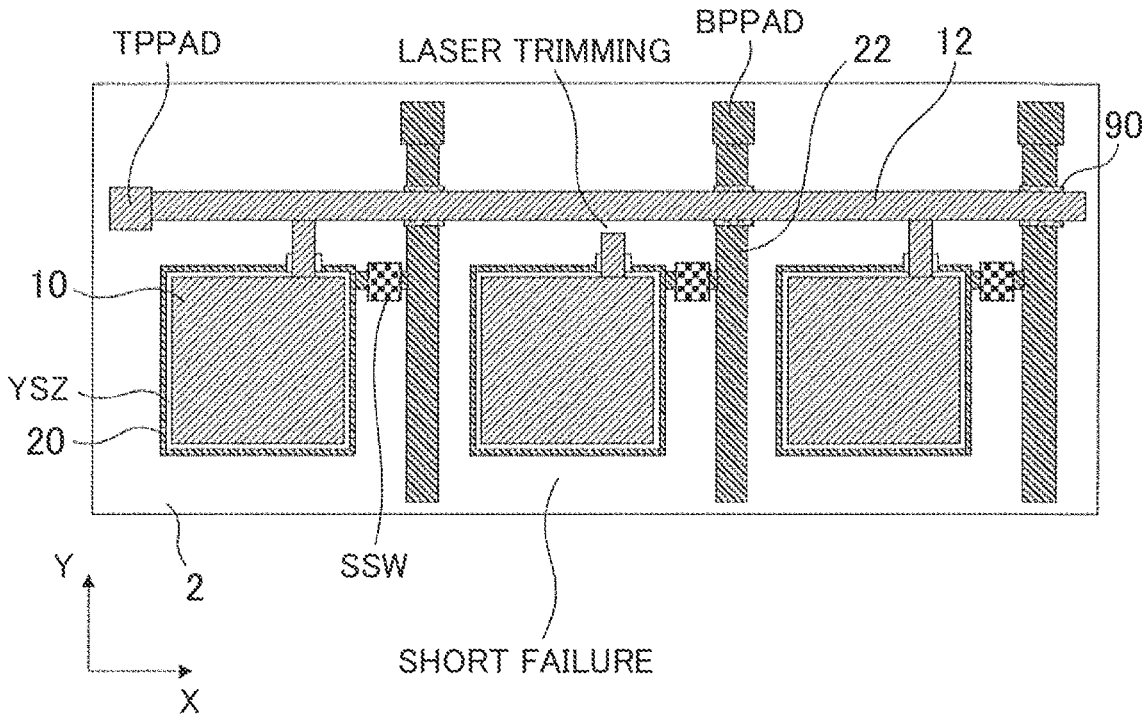
FIG. 27A shows an example in which a cell with a short-circuit failure (ShortFailure) is separated from the upper electrode wiring 12.
Figure 27B:
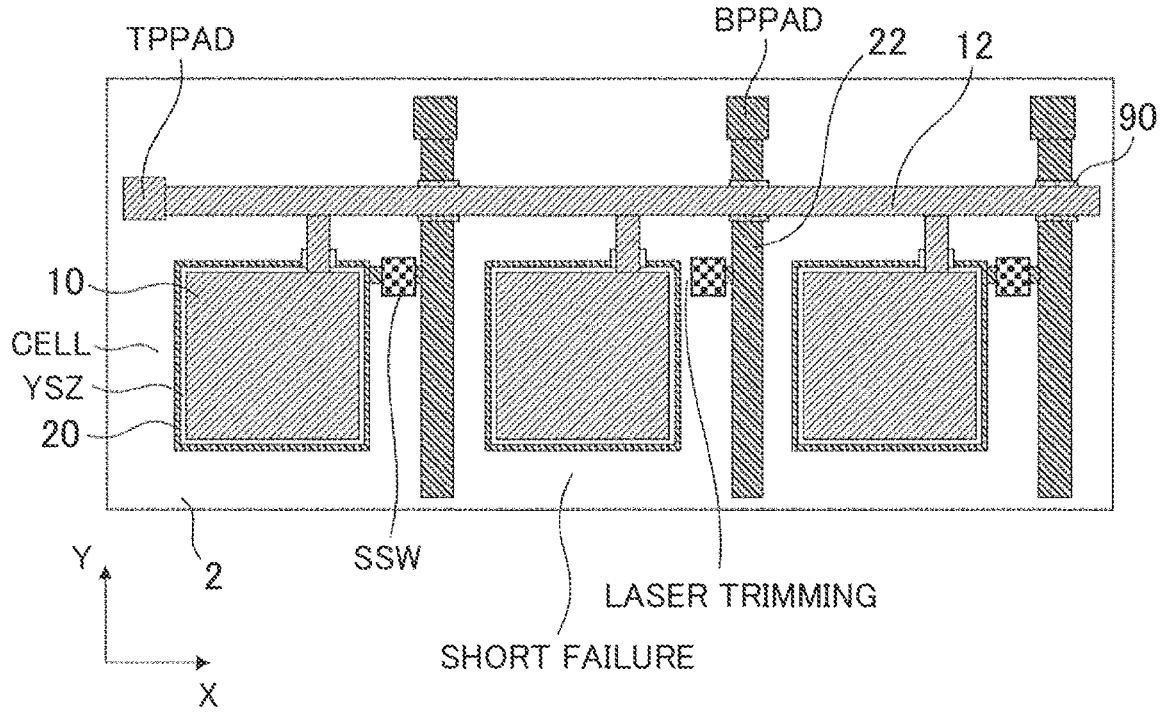
FIG. 27B shows an example in which a cell with a short-circuit failure (ShortFailure) is separated from the lower electrode wiring 22.

FIG. 27A shows an example in which a cell of a short-circuit failure (ShortFailure) is separated from the upper electrode wiring 12. FIG. 27B shows an example in which a cell of a short-circuit failure (ShortFailure) is separated from the lower electrode wiring 22. For example, laser trimming can be used for the separation.

Second Embodiment: Configuration of Selection Switch

Figure 28:
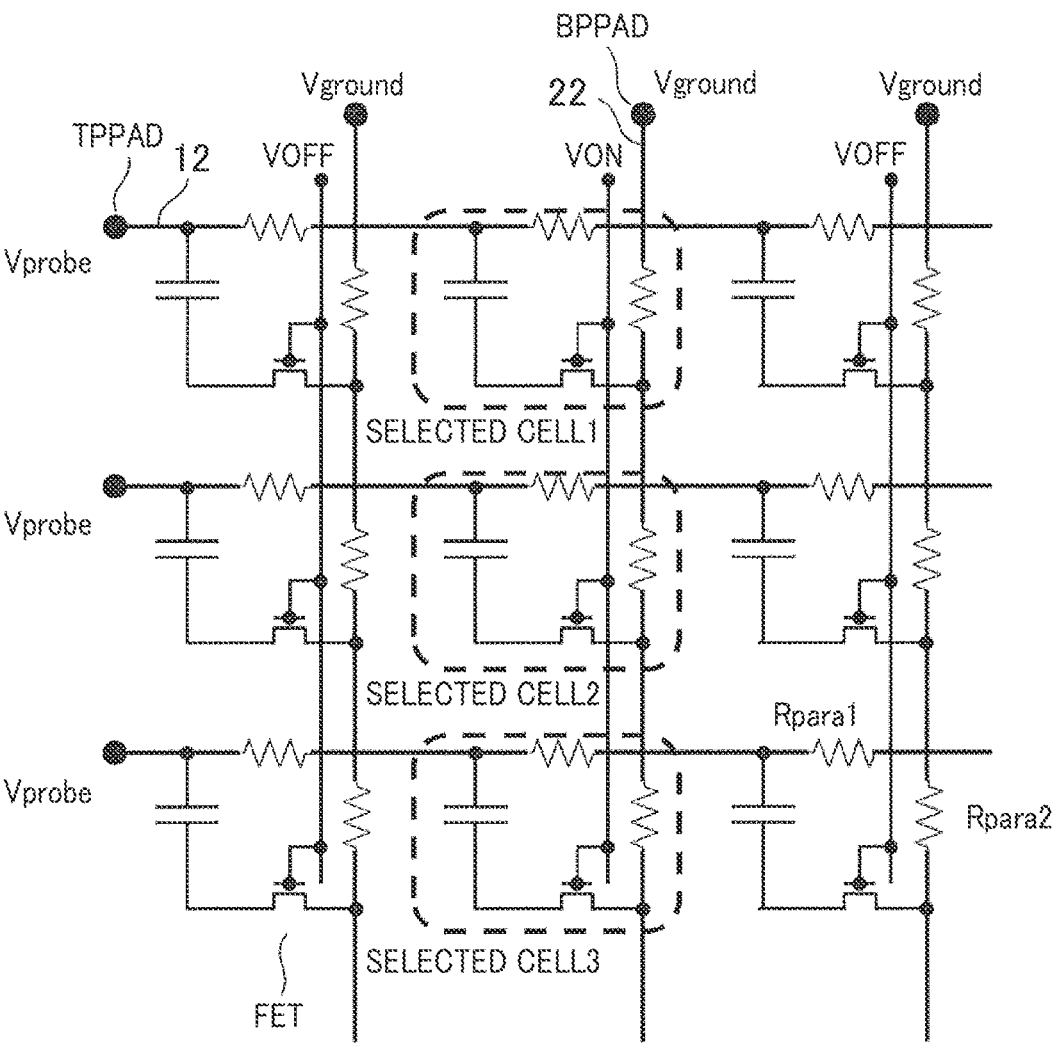
FIG. 28 shows a method of inspecting a short-circuit failure when a field effect transistor FET is used as the selection switch SSW.

FIG. 28 shows a method of inspecting a short-circuit failure when a field effect transistor FET is used as the selection switch SSW. One of the upper electrode wirings 12 and the lower electrode wirings 22 (upper electrode wiring 12 in FIG. 28) can be electrically fed independently of each other. The gates GATEs of the field effect transistors FETs can be shared among the fuel cells 1 arranged in a direction orthogonal to the upper electrode wiring 12. In this case, the lower electrode wirings 22 may be independent or may be bundled at the end to be common. The selected cell can be selected at a position where the gate GATE and each of the upper electrode wirings 12 that can be electrically fed independently of each other intersect. In FIG. 28, selected cell 1, selected cell2, and selected cell3 are selected.

A voltage Vprobe is applied to the upper electrode wiring 12 of each cell, and a Vground (=0V) is applied to the lower electrode wiring 22 to measure a current. If selected cell 1, selected cell2, and selected cell3 are in short-circuit failure, a current of IJ or more flows. If they are non-defective, a current smaller than IJ flows through each upper electrode wiring 12.

It is necessary to be careful when performing a short-circuit inspection on a plurality of cells at the same time as shown in FIG. 28 in the fuel cell array. Since the upper electrode wiring 12 and the lower electrode wiring 22 have small but finite parasitic resistors Rpara1 and Rpara2, respectively, a voltage drop occurs when a current flows. When measuring a plurality of selected cells at the same time, the current flowing through each selected cell flows into the common lower electrode wiring. As a result, for example, the potential of the lower electrode wiring 22 of selected cell1 changes depending on the current flowing through selected cell2 and selected cell3. That is, the voltage applied to selected cell1 changes depending on the current flowing through selected cell2 and selected cell3. Therefore, when the current flowing through selected cell2 and selected cell3 is large even if selected cell1 is originally in short-circuit failure, the voltage applied to the cell is greatly reduced from Vprobe due to the influence of the voltage drop due to the parasitic resistance, and a leak current flowing through selected cell1 decreases, so that it may be erroneously determined as a non-defective product.

Figure 29:
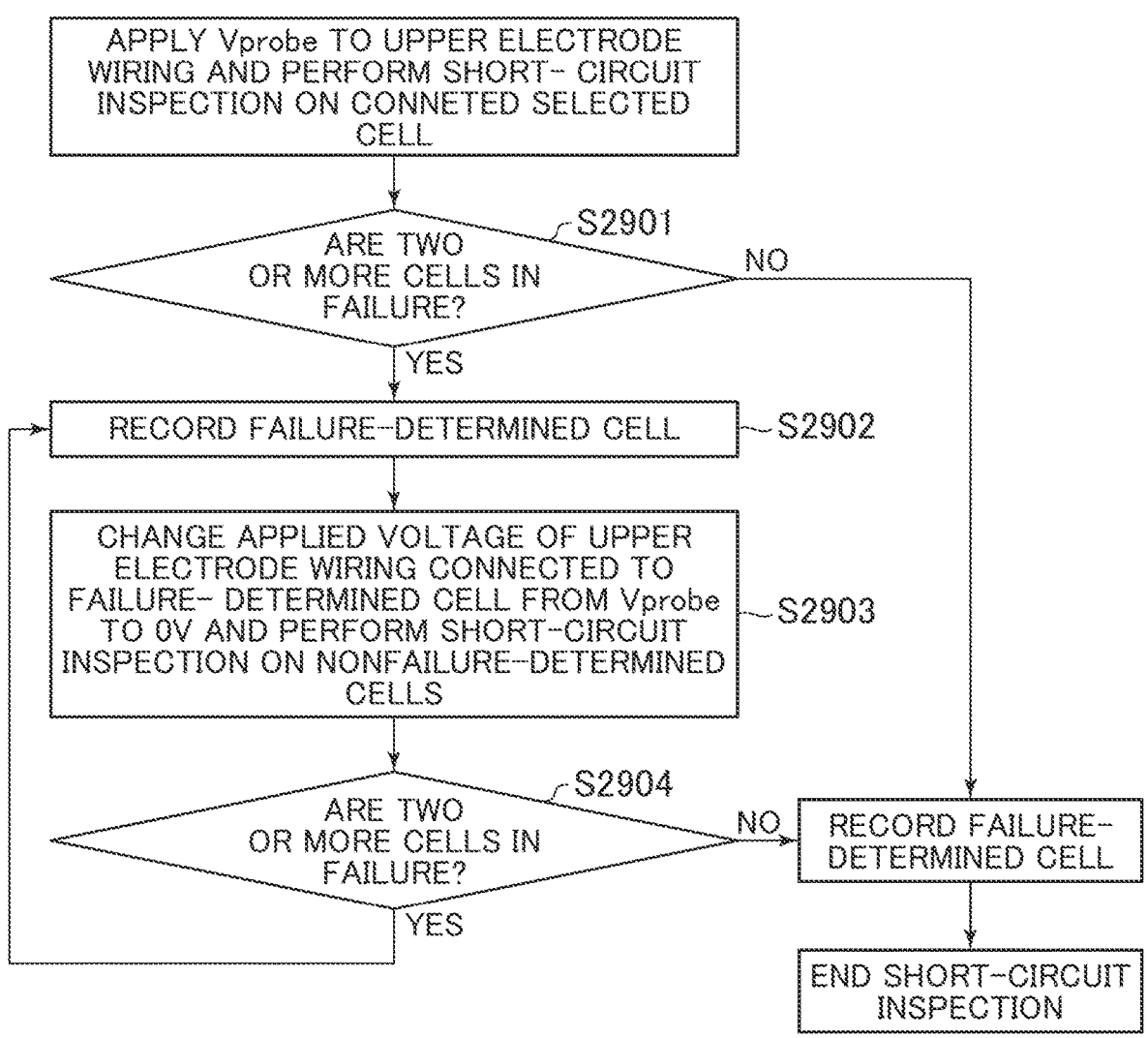
FIG. 29 is a flowchart describing a procedure of preventing false detection when a voltage drop by a parasitic resistance cannot be ignored.

FIG. 29 is a flowchart describing a procedure for preventing false detection when the voltage drop due to the parasitic resistance cannot be ignored. For example, when there are two or more cells in failure in which a current of a leak current IJ or more flows (S2901: YES), the corresponding selected cell is determined to be in failure (S2902). Then, the potential of the upper electrode wiring 12 is changed from Vprobe to 0V, and the remaining selected cells are remeasured (S2903). S2902 to S2903 are repeated until the number of cells in failure becomes 1 or less (S2904).

In the configuration of FIG. 28, even when only any part of selected cells 1 to 3 is in failure and the rest is determined to be non-defective, the cell determined to be non-defective may be actually in failure due to the voltage drop. According to the flowchart of FIG. 29, the cells determined to be non-defective are further inspected by repeating excluding defective cells one by one from the inspection targets in S2903. Thus, the influence of the voltage drop due to the parasitic resistors Rpara1 and Rpara2 can be reduced. When it is known in advance that the voltage drop due to the parasitic resistance by the leakage current can be ignored, the procedure as shown in FIG. 29 is unnecessary.

Figure 30:
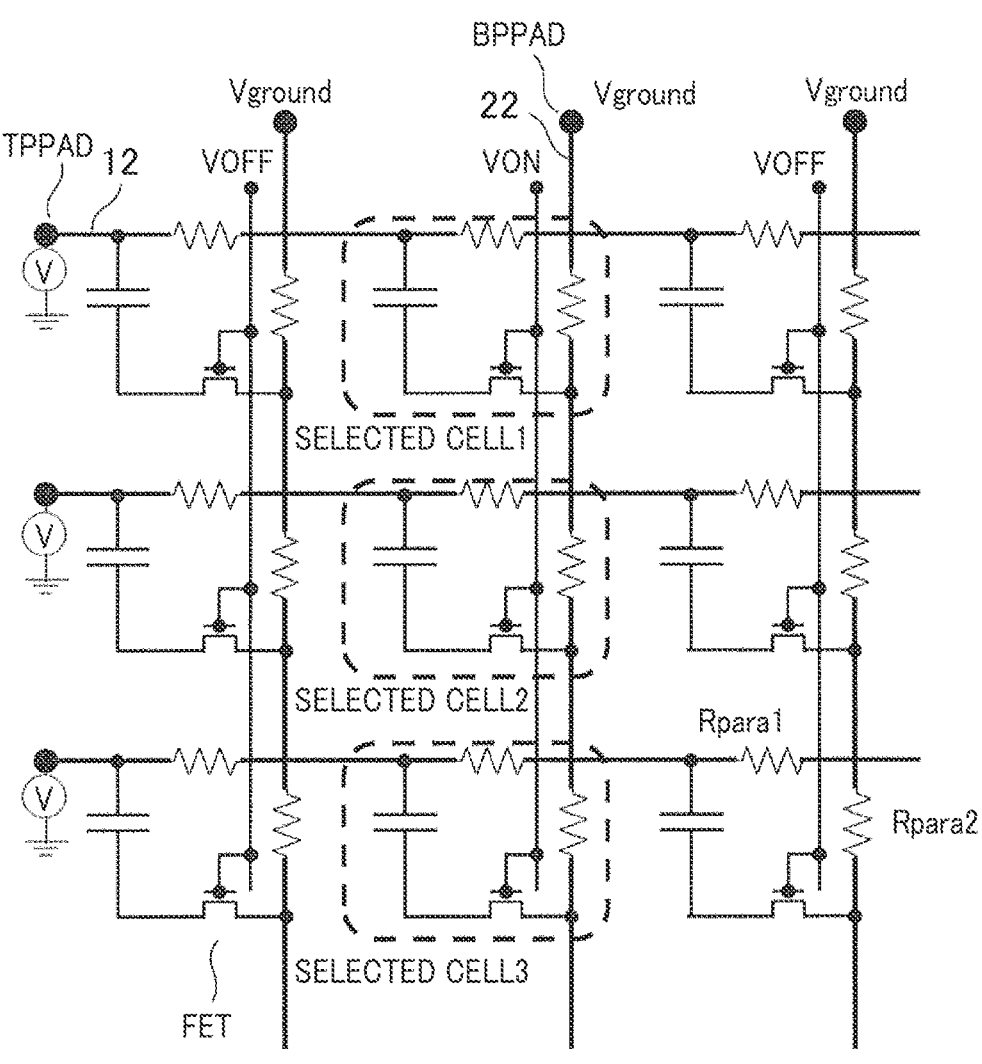
FIG. 30 shows a method of inspecting an output voltage when a field effect transistor FET is used as the selection switch SSW.

FIG. 30 shows a method of inspecting the output voltage when the field effect transistor FET is used as the selection switch SSW. One of the upper electrode wirings 12 and the lower electrode wirings 22 (upper electrode wirings 12 in FIG. 30) can be electrically fed independently, and the gates GATEs can be shared in the direction orthogonal to the upper electrode wiring 12. At this time, the lower electrode wirings 22 may be electrically fed independently or may be made common. Vground=0V is applied to the lower electrode wiring. Hydrogen is supplied to the anode side of the substrate 2, and air is supplied to the cathode side to raise the temperature to about 200° C. By measuring the potential of the upper electrode wiring 12, the potential due to an electromotive force of selected cell is measured. By comparing this potential with a determination voltage VJ, a defective cell is determined.

In FIG. 30, selected cell1, selected cell2, and selected cell3 are measured at the same time. Unlike the case of the short-circuit inspection, since almost no current flows in the measurement of the output voltage, so that the voltage drop due to the parasitic resistors Rpara1 and Rpara2 has almost no effect. It is therefore possible to measure a plurality of cells at the same time.

As with the first embodiment, it is convenient that the field effect transistor FET is brought into an on state when 0V is applied to the gate GATE. At the time of the inspection, selected cell is specified by applying an off voltage to each gate GATE other than that of the selected cell and applying 0V to the gate of the selected cell. In actual use, all gates can be turned on when a ground potential (0V) is applied to all the gates.

Figure 31:
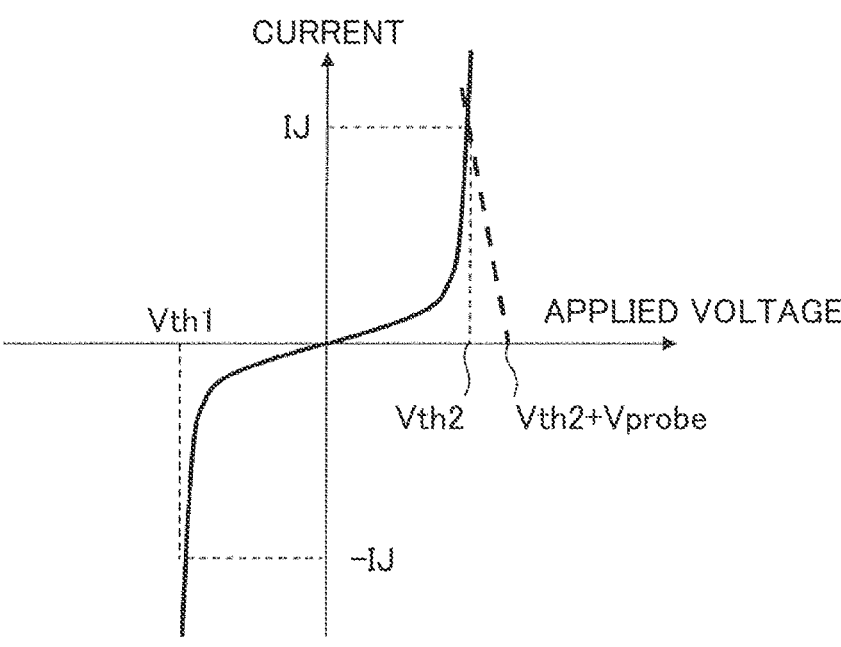
FIG. 31 shows a current-voltage characteristic of the threshold switch TS and a load line of a cell in failure through which a current IJ flows with respect to an applied voltage of Vprobe.

FIG. 31 shows a current-voltage characteristic of a threshold switch TS and a load line of a defective cell in which a current IJ flows with respect to the applied voltage of Vprobe. The threshold switch TS can also be used as the selection switch SSW. In this case, the current flowing during the short-circuit inspection flows through the fuel cell 1 and the threshold switch TS in series. Even if Vprobe is applied to both ends of the series connection between the fuel cell 1 and the threshold switch TS, the threshold switch TS stops the current. However, by setting the voltage applied to both ends to Vth2+Vprobe, a current of IJ or more can flow when selected cell is defective, and a current smaller than IJ can flow when it is non-defective.

Figure 32:
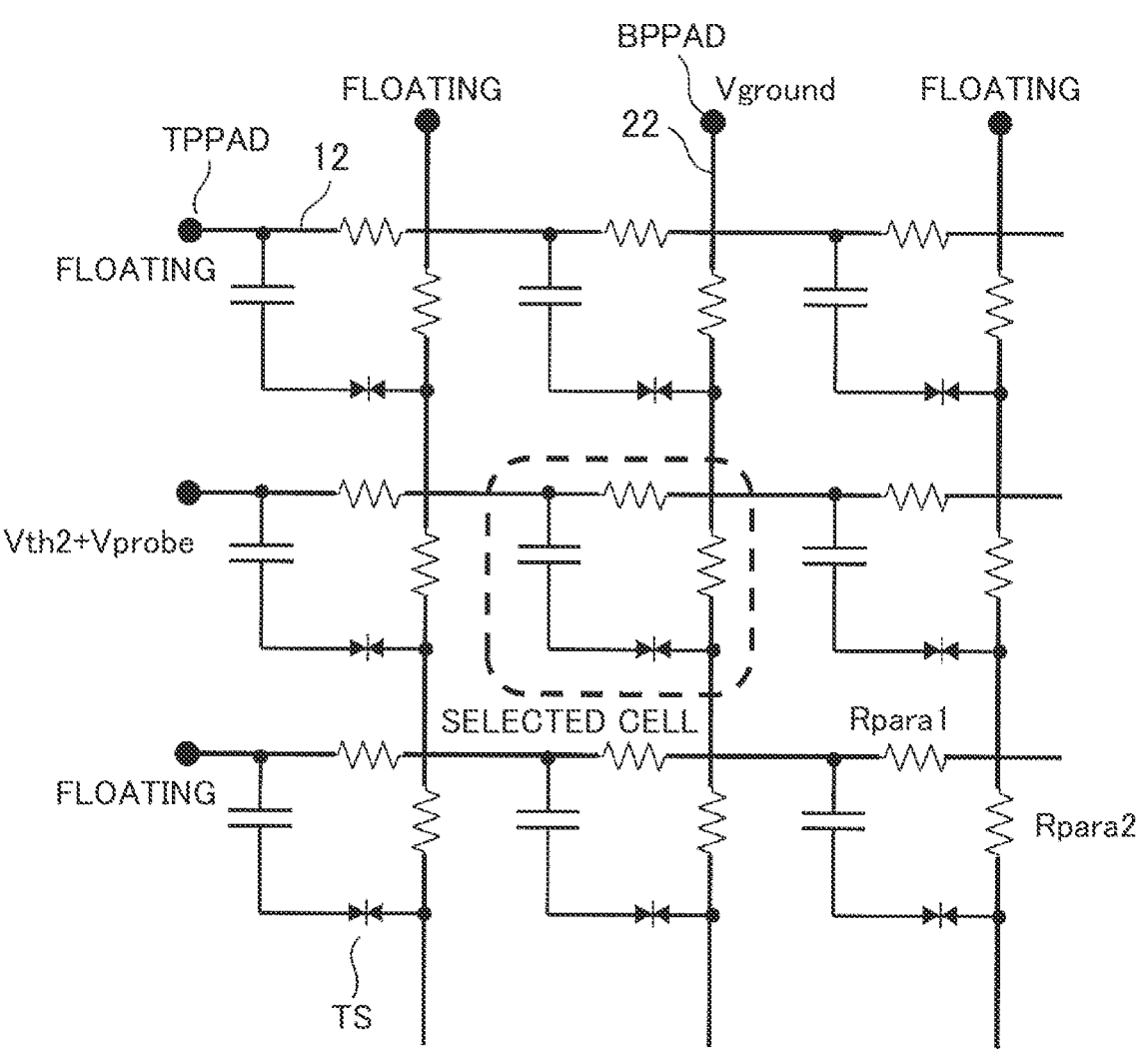
FIG. 32 is an example in which the threshold switch TS is used as the selection switch SSW.

FIG. 32 is an example in which the threshold switch TS is used as the selection switch SSW. Voltage conditions for inspection are also shown together. Vth2+Vprobe is applied to the upper electrode wiring 12 connected to selected cell, Vground (=0V) is applied to the lower electrode wiring 22 connected to selected cell, and the upper electrode wirings 12 and the lower electrode wirings 22 other than the above are put in a floating state.

In selected cell, Vth2+Vprobe is applied between the upper electrode wiring 12 and the lower electrode wiring 22. If selected cell is defective, a current higher than IJ will flow. If it is a non-defective product, a current smaller than IJ will flow. There are current paths that bypass other than selected cell, but these paths go through three or more cells in series. These paths are paths which flow through three or more threshold switches TSs. The current that flows is very small unless a voltage larger than $2 \times |Vth1|+Vth2$ is applied. If $2 \times |Vth1|+Vth2 > Vth2+Vprobe$, that is, if $|Vth1| > Vprobe/2$, a sneak current hardly flows even if the fuel cell 1 other than selected cell is in short-circuit failure. Thus, the short-circuit inspection of selected cell can be performed without being affected by the sneak current.

Figure 33:
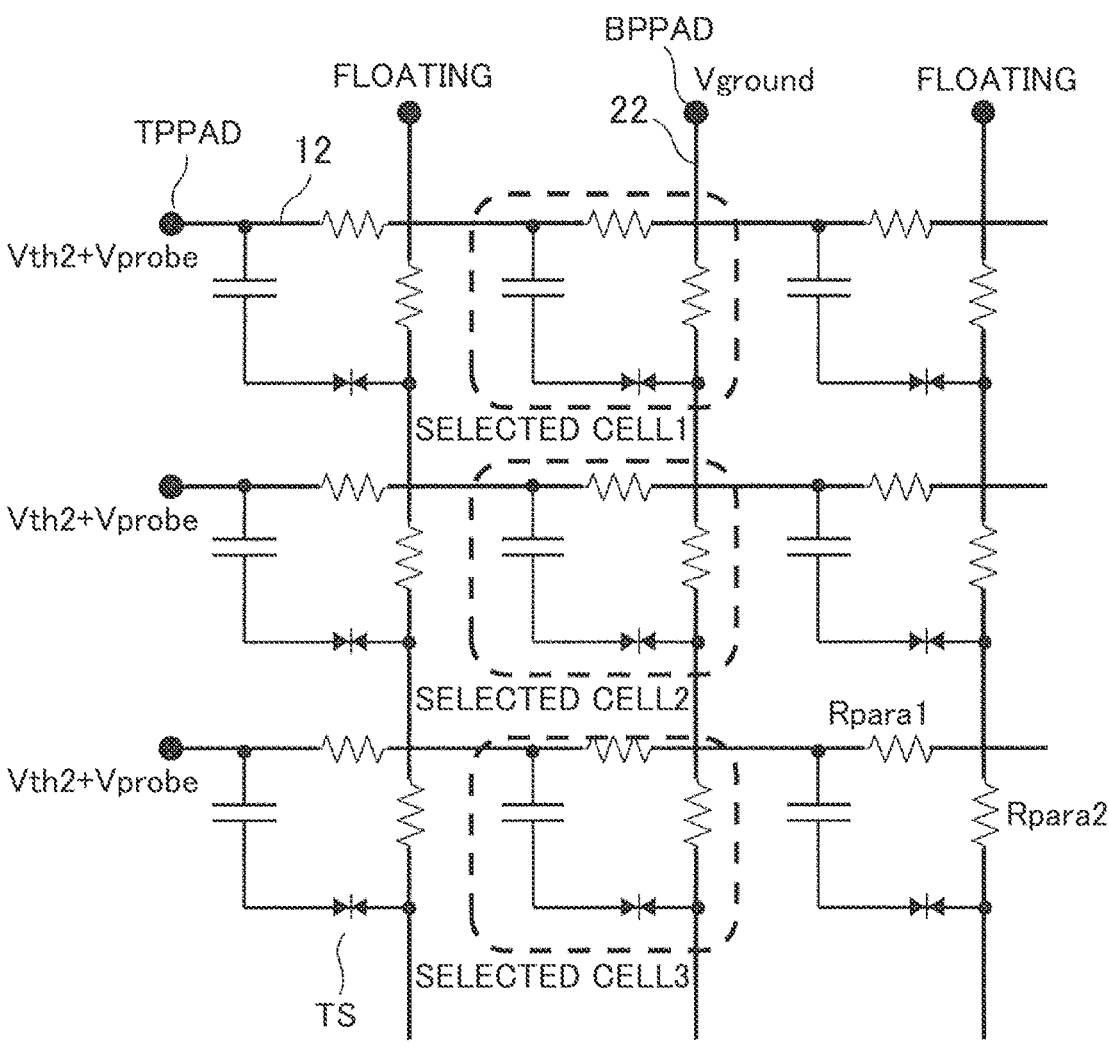
FIG. 33 is an example in which a short-circuit inspection is performed on a plurality of cells at the same time.

FIG. 33 is an example of performing a short-circuit inspection on a plurality of cells at the same time. FIG. 32 shows a method of performing a short-circuit inspection on one selected cell, but in principle, a plurality of cells can be simultaneously inspected under the voltage conditions shown in FIG. 33. However, as in the case where the field effect transistor FET described in FIGS. 28 and 29 is used as the selection switch SSW, attention should be paid to false detection due to the influence of the parasitic resistance.

In order to prevent false detection when the voltage drop due to the parasitic resistance cannot be ignored, it is necessary to use the same flow as in FIG. 29. For example, when there are a plurality of cells in failure in which a current of a leakage current IJ or more flows, the corresponding selected cell is determined to be defective. Then, the potential of the upper electrode wiring 12 is changed from Vth+Vprobe to Floating, and the remaining selected cells are remeasured. By repeating this until a plurality of cells in failure are no longer detected, the influence of the parasitic resistors Rpara1 and Rpara2 can be reduced. Such attention is not necessary if it is known in advance that the voltage drop due to the parasitic resistance by the leakage current can be ignored.

Figure 34:
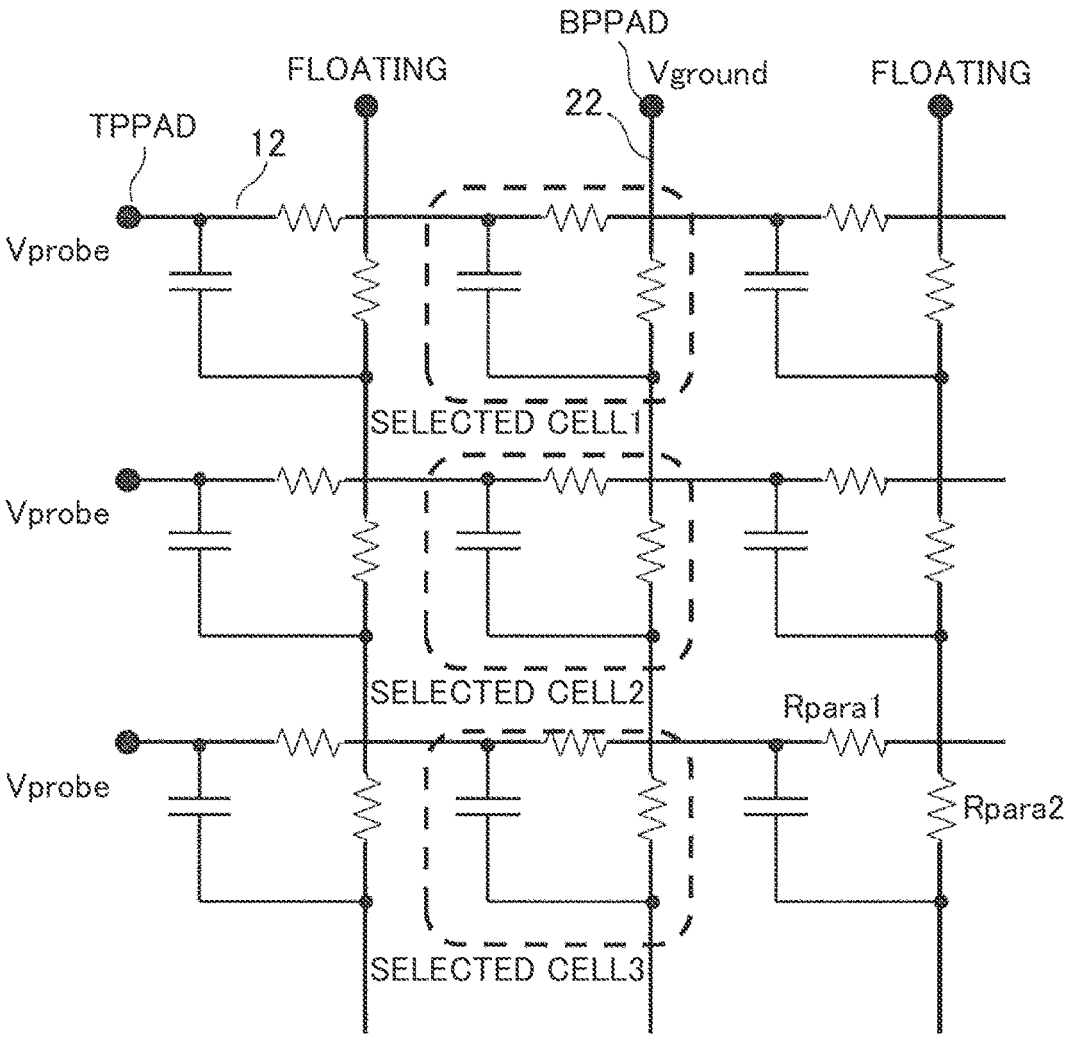
FIG. 34 shows voltage conditions when executing a short-circuit inspection in a fuel cell array having no selection switch SSW.

FIG. 34 shows voltage conditions when a short-circuit inspection is performed in a fuel cell array with no selection switch SSW. The method of simultaneously short-circuit inspecting a plurality of selected cells as shown in FIG. 33 may be possible even in a fuel cell array with no selection switch SSW. When it is known in advance that the voltage drop in the parasitic resistor Rpara due to the leak current can be ignored, simultaneous inspection of plural cells is possible under the conditions shown in FIG. 34, but when the voltage drop cannot be ignored, it is extremely difficult to prevent false detection. This is because if the potentials applied to the upper electrode wiring 12 are not all the same by using the same flow as in FIG. 29, the sneak current cannot be suppressed because there is no selection switch SSW. FIG. 34 can be used where the voltage drop due to the parasitic resistance is negligible, such as where only a very small number of fuel cells 1 are short-circuited.

Figure 35:
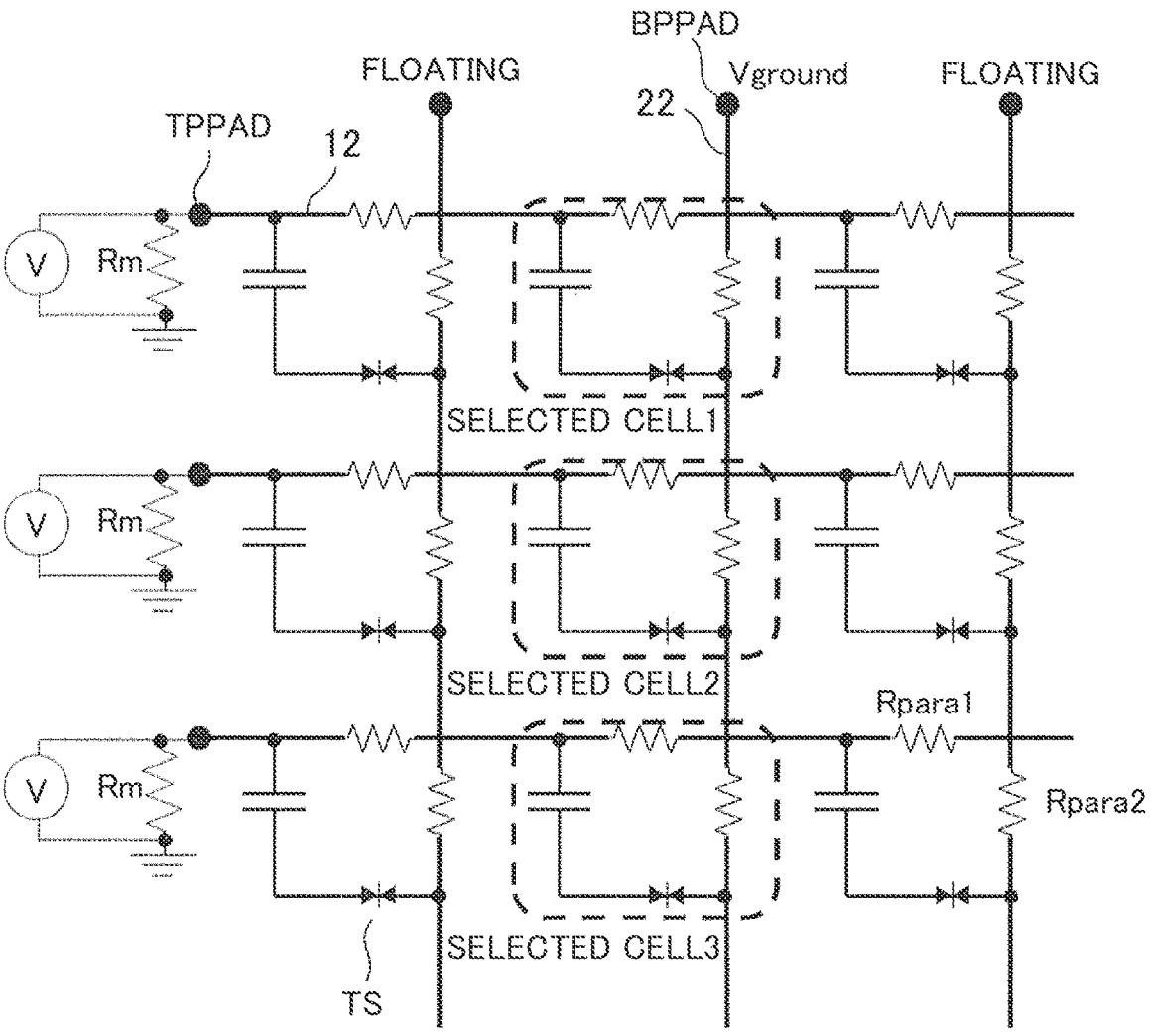
FIG. 35 shows a method of testing an output voltage when the threshold switch TS is used as the selection switch SSW.

FIG. 35 shows a method of testing the output voltage when the threshold switch TS is used as the selection switch SSW. Description will be made assuming that the upper electrode layer 10 is a cathode and the lower electrode layer 20 is an anode. The upper electrode wirings 12 can be electrically fed independently, and hydrogen is supplied to the anode side of one row in the direction orthogonal to the upper electrode wiring 12 to fix it to 0V (selected cells 1 to 3). Other anode wirings are put in a floating state. Air is supplied to both the anode and the cathode in cells other than the one-row fuel cells 1 that supply hydrogen to the anode side to raise the temperature to about 200° C. or higher. In so doing, power generation occurs only in one row of fuel cells 1 that supply hydrogen to the anode side. The potential of the upper electrode wiring 12 is measured by a standard resistance Rm and a voltmeter.

Figure 36:
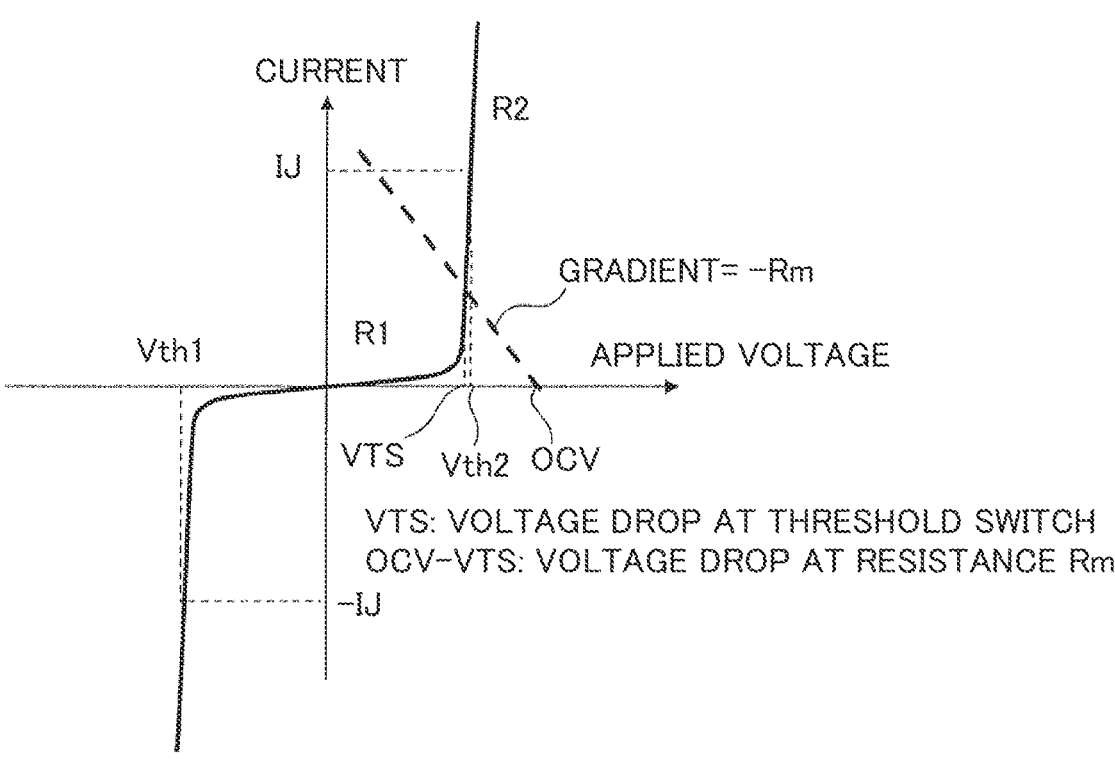
FIG. 36 is a current-voltage characteristic of the threshold switch TS.

FIG. 36 shows a current-voltage characteristic of the threshold switch TS. A resistance in a constant current region smaller than Vth2 of the threshold switch TS is taken to be R1, and a resistance in a large current region larger than Vth2 is taken to be R2. When Rm is selected to a value sufficiently smaller than R1 and sufficiently larger than R2, the voltage applied to Rm becomes OCV−TS≈OCV−Vth2 as shown by a load line in FIG. 36 when OCV is larger than Vth2. When OCV is smaller than Vth2, it becomes almost 0V. If the influence of a sneak current can be ignored, the normal fuel cell 1 and the defective fuel cell 1 can be discriminated by measuring the voltage applied to the resistor Rm.

Assuming that the maximum open circuit voltage OCV of the fuel cell 1 is V0, the potential of the upper electrode wiring 12 connected to the fuel cell 1 is V0–Vth2. When the adjacent fuel cell 1 is in failure, OCV<Vth2 in an extreme case. In this case, the potential of the upper electrode wiring 12 connected to the cell in failure becomes 0V.

The sneak current can be suppressed if (V0–Vth2)<Vth1+Vth2, that is, V0<Vth1+2×Vth2 is satisfied. That is, Vth1 and Vth2 may be designed so that Vth2<V0<Vth1+2Vth2.

As the materials used for the lower electrode layer 20, the lower electrode wiring 22, and the metal oxide MO, the same materials as in the first embodiment can be used. As a candidate for the metal oxide MO, one is preferable in which it operates as the threshold switch TS by the combination of the lower electrode layer 20 and the lower electrode wiring 22 at the time of inspection, but the metal oxide MO is metallized by annealing treatment before actual use to make a low resistance contact. This is because the threshold switch TS is necessary at the time of inspection, but in actual use, it behaves as a parasitic resistor and causes power loss. When platinum oxide PtO2, nickel oxide, titanium oxide, cobalt oxide or the like is used as the metal oxide MO, the resistance can be reduced by reduction annealing at about 500° C.

Figure 37:
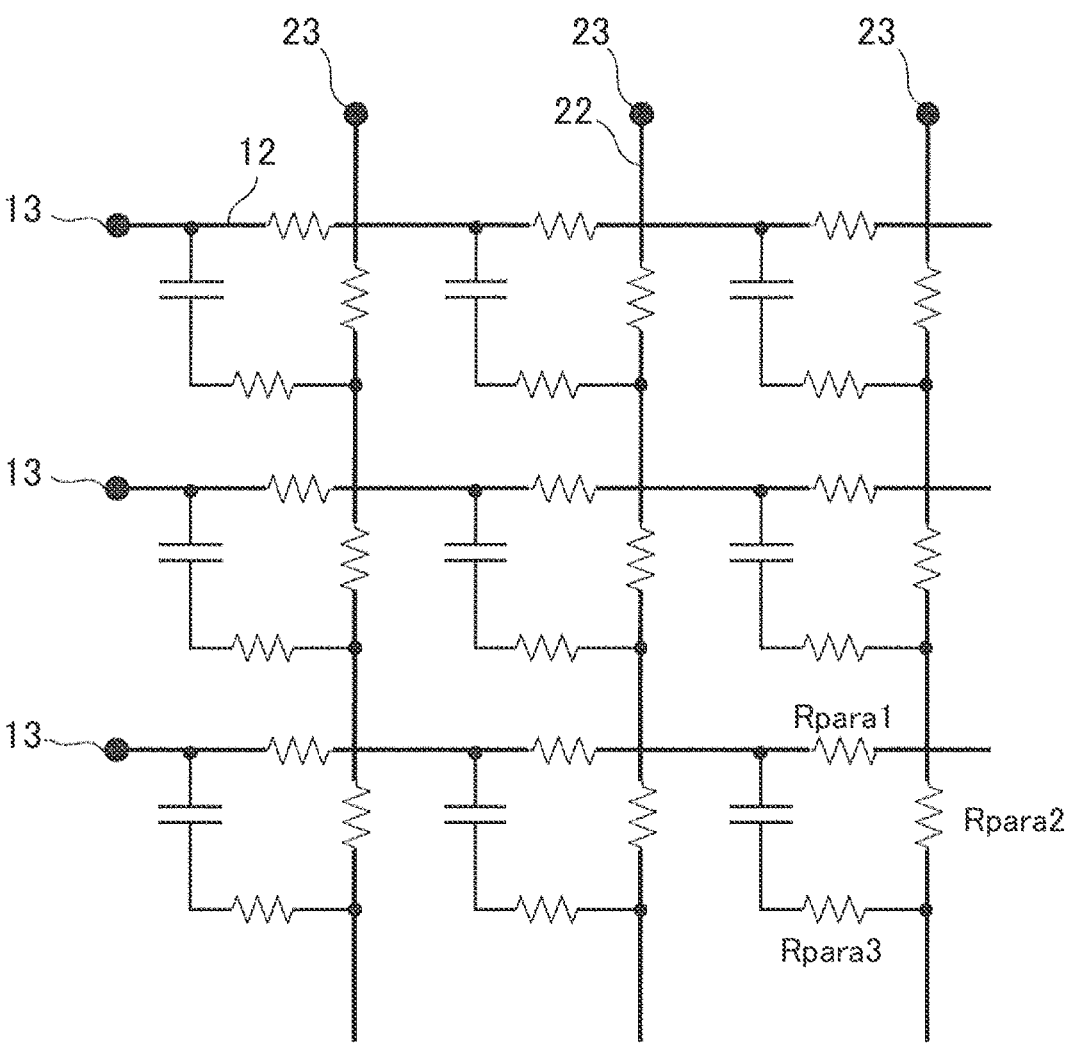
FIG. 37 is an equalization circuit diagram after reduction annealing.

FIG. 37 is an equalization circuit diagram after reduction annealing. When the metal oxide MO is lowered in resistance by reduction annealing, the threshold switch TS becomes a parasitic resistance Rpara3 in terms of circuit, and the circuit diagram is as shown in FIG. 37. If Rpara3 can be made sufficiently small, the influence of the threshold switch TS which becomes unnecessary at the time of power generation can be eliminated.

By using the technique of the present second embodiment, the module cost per electric power (Module cost/ output power) can be reduced by thinning the solid electrolyte layer 100 as with the first embodiment.

Third Embodiment

Unlike FIG. 2, for example, a mixed gas of a fuel gas containing hydrogen and a gas containing oxygen such as air may be supplied to the entire fuel cell 1. In this case, the same mixed gas is supplied to the lower electrode layer 20 and the upper electrode layer 10, but since the electrodes are different in shape, a potential difference is generated and power is generated. The electromotive force can be increased by changing the electrode material between the lower electrode layer 20 and the upper electrode layer 10.

Such a fuel cell is called a single chamber type fuel cell. The single chamber type fuel cell has the advantage that it becomes simple in structure and can be reduced in system cost because it is not necessary to separate and seal a system of a gas containing a fuel gas and a system of a gas containing an oxidizing agent such as oxygen. In the third embodiment of the present invention, description will be made as to a configuration example in which a fuel cell system including the fuel cell 1 is configured as a single chamber type.

Figure 38:
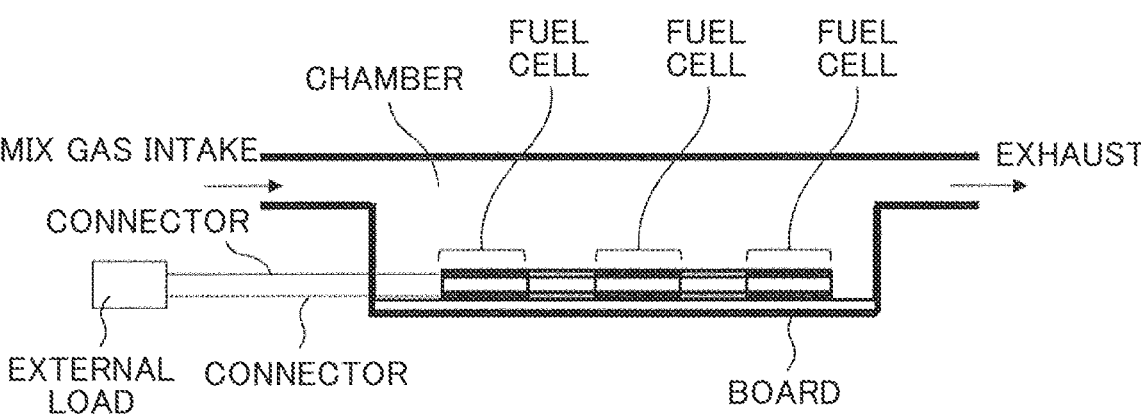
FIG. 38 is a configuration example of a fuel cell system according to a third embodiment.
Figure 38:
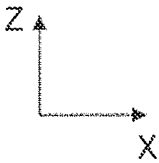

FIG. 38 is a configuration example of the fuel cell system according to the third embodiment of the present invention. The gas introduced into a module is a mixed gas of oxygen and a fuel gas. The mixed gas flows along mix gas intake, chamber, and exhaust. Wiring is pulled out from an anode electrode and a cathode electrode of a fuel cell by a connector and connected to an external load. The fuel cell is mounted on a support substrate Board. Although one fuel cell may be used, a plurality of fuel cells are generally arranged. The fuel cells 1 of the first and second embodiments can be used for the fuel cell of FIG. 38.

Also, in the case of the single chamber type cell of the present third embodiment, the module cost per electric power (Module cost/output power) can be reduced by thinning the solid electrolyte layer 100 in a manner similar to the first and second embodiments.

LIST OF REFERENCE SIGNS

1 . . . fuel cell,
2 . . . substrate,
3 . . . insulating film,
10 . . . upper electrode layer,
20 . . . lower electrode layer,
11 . . . current collecting wiring,
21 . . . current collecting wiring,
12 . . . upper electrode wiring,
22 . . . lower electrode wiring,
13 . . . electrode pad,
23 . . . electrode pad,
14 . . . upper electrode probe pad,
24 . . . lower electrode probe pad,
60 . . . channel semiconductor layer,
90 . . . insulating film,
100 . . . solid electrolyte layer.

The invention claimed is:

1. A fuel cell array comprising a plurality of fuel cells, wherein
the fuel cell includes:
a first electrode layer,
a solid electrolyte layer,
a second electrode layer, and
a connection element having one end connected to the first electrode layer,
the fuel cell array further includes a first wiring and a second wiring,
the first wiring is connected to the second electrode layer of each of the fuel cells,
the second wiring is connected to the other end of the connection element of each of the fuel cells, and
the connection element has a structure in which a conductive layer is sandwiched between two electrodes.

2. The fuel cell array according to claim 1, wherein at least any of the fuel cells is cut off by the first wiring or the second wiring.

3. The fuel cell array according to claim 1,
wherein the connection element is configured so that the two electrodes are comprised of a metal layer, and the conductive layer is comprised of a metal oxide, and at least a part of the metal oxide is reduced and metallized to thereby operate as a wiring to constantly conduct between the fuel cell and the second wiring, or
the connection element is configured so that the two electrodes are comprised of a metal layer, and the conductive layer is comprised of a porous metal layer to thereby operate as a wiring to constantly conduct between the fuel cell and the second wiring.

4. The fuel cell array according to claim 1, wherein
the connection element is configured by sandwiching by the two electrodes, a laminated body in which an N-type semiconductor layer and a P-type semiconductor layer are laminated, and the connection element is configured so that at least a part of the N-type semiconductor layer and the P-type semiconductor layer is reduced and metallized to thereby operate as a wiring to constantly conduct between the fuel cell and the second wiring, or the connection element is configured so that the two electrodes are comprised of a metal layer, and the conductive layer is comprised of a porous conductive layer to thereby operate as a wiring to constantly conduct between the fuel cell and the second wiring, or the connection element is configured by sandwiching by the two electrodes, a laminated body in which an N-type semiconductor layer and a P-type semiconductor layer are laminated, and the connection element is configured so that carriers are diffused between the N-type semiconductor layer and the P-type semiconductor layer to thereby operate as a wiring to constantly conduct between the fuel cell and the second wiring.

5. The fuel cell array according to claim 1, wherein the connection element includes a gate electrode electrically connected to the conductive layer, the connection element is configured so that the two electrodes are comprised of a metal layer, and the conductive layer is comprised of a metal oxide, and at least a part of the conductive layer is reduced and metallized to thereby operate as a wiring to constantly conduct between the fuel cell and the second wiring, or the connection element is configured so that the two electrodes are comprised of a metal layer, and the conductive layer is comprised of a porous conductive layer to thereby operate as a wiring to constantly conduct between the fuel cell and the second wiring.

6. The fuel cell array according to claim 1, wherein at least any of the respective fuel cells includes a first lead-out electrode pad electrically conducted to the second electrode layer, or the fuel cell array further includes a first lead-out electrode pad electrically conducted to the first wiring.

7. The fuel cell array according to claim 1, wherein each of the respective fuel cells includes a second lead-out electrode pad electrically conducted to the first electrode layer.

8. The fuel cell array according to claim 1, wherein the first wiring and the second wiring extend in a direction of crossing each other, and a plurality of the fuel cell arrays are arranged along a first direction in which the first wiring extends, and a plurality of the fuel cell arrays are arranged along a second direction in which the second wiring extends, so that the fuel cell arrays are arranged in an array form.

9. The fuel cell array according to claim 8, wherein the connection element is configured as a field effect transistor, and gate terminals of the respective field effect transistors included in each fuel cell arranged along the direction in which the second wiring extends are electrically connected to each other.

10. A method of inspecting a fuel cell array including a plurality of fuel cells, the fuel cell including a first electrode layer, a solid electrolyte layer, a second electrode layer, and a connection element having one end connected to the first electrode layer, the fuel cell array further including a first wiring and a second wiring, the first wiring being connected to the second electrode layer of each of the fuel cells, the second wiring being connected to the other end of the connection element of each of the fuel cells, and the connection element having a structure in which a conductive layer is sandwiched between two electrodes, the method comprising a step of applying a voltage between the first electrode layer and the second electrode layer to the fuel cell in which the connection element is turned off to monitor an output current, thereby determining whether the fuel cell applied with the voltage is in short-circuit failure, or a step of generating electricity from the fuel cell with the connection element turned off to monitor an output voltage, thereby determining whether the electricity-generated fuel cell is a defective product or not.

11. The fuel cell inspection method according to claim 10, wherein the first wiring and the second wiring extend in a direction of crossing each other, a plurality of the fuel cell arrays are arranged along a first direction in which the first wiring extends, and a plurality of the fuel cell arrays are arranged along a second direction in which the second wiring extends, so that the fuel cell arrays are arranged in an array form, the connection element is configured as a field effect transistor, gate terminals of the respective field effect transistors included in each fuel cell arranged along the direction in which the second wiring extends are electrically connected to each other through the second wiring, and the step of determining whether the fuel cell is in short-circuit failure includes:

a step of applying an on voltage to turn on the field effect transistor to each of the gate terminals electrically connected to each other, a step of monitoring an output current of each fuel cell applied with the on voltage to thereby determine whether at least any of the fuel cells each applied with the on voltage is in short-circuit failure, and a step of, when it is determined that only a part of the fuel cells each applied with the on voltage is in short-circuit failure, changing the voltage between the first electrode layer and the second electrode layer to 0V with respect to any one of the fuel cells excepting the fuel cell determined to be in short-circuit failure and repeating monitoring the output current anew, thereby further detecting the fuel cell being in short-circuit failure.

12. The fuel cell inspection method according to claim 10, wherein the first wiring and the second wiring extend in a direction of crossing each other, a plurality of the fuel cell arrays are arranged along a first direction in which the first wiring extends, and a plurality of the fuel cell arrays are arranged along a second direction in which the second wiring extends, so that the fuel cell arrays are arranged in an array form, the connection element is configured as a field effect transistor, and gate terminals of the respective field effect transistors included in each fuel cell arranged along the direction in which the second wiring extends are electrically connected to each other through the second wiring, and the step of determining whether the electricity-generated fuel cell is the defective product or not includes:

a step of applying an on voltage to turn on the field effect transistor to each of the gate terminals electrically connected to each other, and a step of generating electricity from each fuel cell applied with the on voltage to monitor an output voltage, thereby collectively determining whether each fuel cell applied with the on voltage is a defective product or not.

13. The fuel cell inspection method according to claim 10, wherein the first wiring and the second wiring extend in a direction of crossing each other, a plurality of the fuel cell arrays are arranged along a first direction in which the first wiring extends, and a plurality of the fuel cell arrays are arranged along a second direction in which the second wiring extends, so that the fuel cell arrays are arranged in an array form, and the connection element is configured as a threshold switch by sandwiching a metal oxide by two metal layers, and the step of determining whether the fuel cell is in short-circuit failure or not includes:

a step of applying a voltage larger than a threshold voltage of the threshold switch to the fuel cell to be inspected to monitor an output current, thereby determining whether the fuel cell is in short-circuit failure.

14. The fuel cell inspection method according to claim 10, wherein the first wiring and the second wiring extend in a direction of crossing each other, a plurality of the fuel cell arrays are arranged along a first direction in which the first wiring extends, and a plurality of the fuel cell arrays are arranged along a second direction in which the second wiring extends, so that the fuel cell arrays are arranged in an array form, the connection element is configured as a threshold switch by sandwiching a metal oxide by two metal layers, and the other ends of the respective connection elements included in the fuel cells arranged along the direction in which the second wiring extends are electrically connected to each other through the second wiring, and the step of determining whether the electricity-generated fuel cell is the defective product includes:

a step of generating electricity from each of the fuel cells in which the connection elements are electrically connected to each other to monitor an output voltage, thereby collectively determining whether each of the fuel cells is a defective product or not.

* * * * *